United States Patent
Cho et al.

(10) Patent No.: US 11,139,343 B2
(45) Date of Patent: Oct. 5, 2021

(54) DISPLAY DEVICE

(71) Applicant: LG DISPLAY CO., LTD., Seoul (KR)

(72) Inventors: Eunil Cho, Paju-si (KR); Howon Choi, Paju-si (KR); YongBaek Lee, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 150 days.

(21) Appl. No.: 16/688,254

(22) Filed: Nov. 19, 2019

(65) Prior Publication Data
US 2020/0176521 A1 Jun. 4, 2020

(30) Foreign Application Priority Data

Dec. 3, 2018 (KR) .......................... 10-2018-0153278

(51) Int. Cl.
*H01L 27/32* (2006.01)
*H01L 51/52* (2006.01)
*H01L 51/56* (2006.01)

(52) U.S. Cl.
CPC ...... *H01L 27/3211* (2013.01); *H01L 27/3246* (2013.01); *H01L 27/3248* (2013.01); *H01L 27/3272* (2013.01); *H01L 51/5212* (2013.01); *H01L 51/5218* (2013.01); *H01L 51/56* (2013.01); *H01L 27/322* (2013.01); *H01L 2251/5315* (2013.01)

(58) Field of Classification Search
CPC ............ H01L 27/3211; H01L 27/3246; H01L 27/3248; H01L 27/3272; H01L 27/322; H01L 51/5212; H01L 51/5218; H01L 51/56; H01L 2251/5315
See application file for complete search history.

(56) References Cited

U.S. PATENT DOCUMENTS

| 10,008,555 | B2 | 6/2018 | Yoo et al. | |
| 2010/0176717 | A1* | 7/2010 | Lee | H01L 51/5271 313/504 |
| 2014/0239272 | A1* | 8/2014 | Kim | H01L 51/5271 257/40 |
| 2016/0336385 | A1* | 11/2016 | Li | H01L 27/1248 |

(Continued)

FOREIGN PATENT DOCUMENTS

| KR | 10-2016-0112160 A | 9/2016 |
| KR | 10-1695652 B1 | 1/2017 |

*Primary Examiner* — Shaun M Campbell
(74) *Attorney, Agent, or Firm* — Morgan, Lewis & Bockius LLP

(57) ABSTRACT

A display device includes a substrate provided with a first subpixel and a second subpixel; a first electrode provided on the substrate, including a first sub electrode provided on the first subpixel and a second sub electrode provided on the second subpixel; a transparent electrode including a first transparent electrode provided to cover the first sub electrode and a second transparent electrode provided to cover the second sub electrode; an organic light emitting layer including a first organic light emitting layer arranged on the first transparent electrode and a second organic light emitting layer arranged on the second transparent electrode; a second electrode arranged on the organic light emitting layer; a first bank provided between the first transparent electrode and the second transparent electrode to partition the first subpixel and the second subpixel from each other; and a first color filter arranged to correspond to the first subpixel.

17 Claims, 18 Drawing Sheets

(56) References Cited

U.S. PATENT DOCUMENTS

| | | | |
|---|---|---|---|
| 2017/0077190 A1* | 3/2017 | Hashimoto | H05B 33/10 |
| 2017/0294493 A1 | 10/2017 | Yoo et al. | |
| 2017/0338444 A1* | 11/2017 | Teramoto | H01L 27/3211 |
| 2018/0062116 A1* | 3/2018 | Park | H01L 51/5234 |
| 2019/0006436 A1* | 1/2019 | Gong | G09G 3/3266 |
| 2019/0198819 A1* | 6/2019 | Shin | H01L 27/322 |
| 2020/0135823 A1* | 4/2020 | Choi | H01L 27/1251 |
| 2020/0212111 A1* | 7/2020 | Kim | H01L 51/5275 |
| 2020/0212347 A1* | 7/2020 | Park | H01L 51/5218 |

* cited by examiner

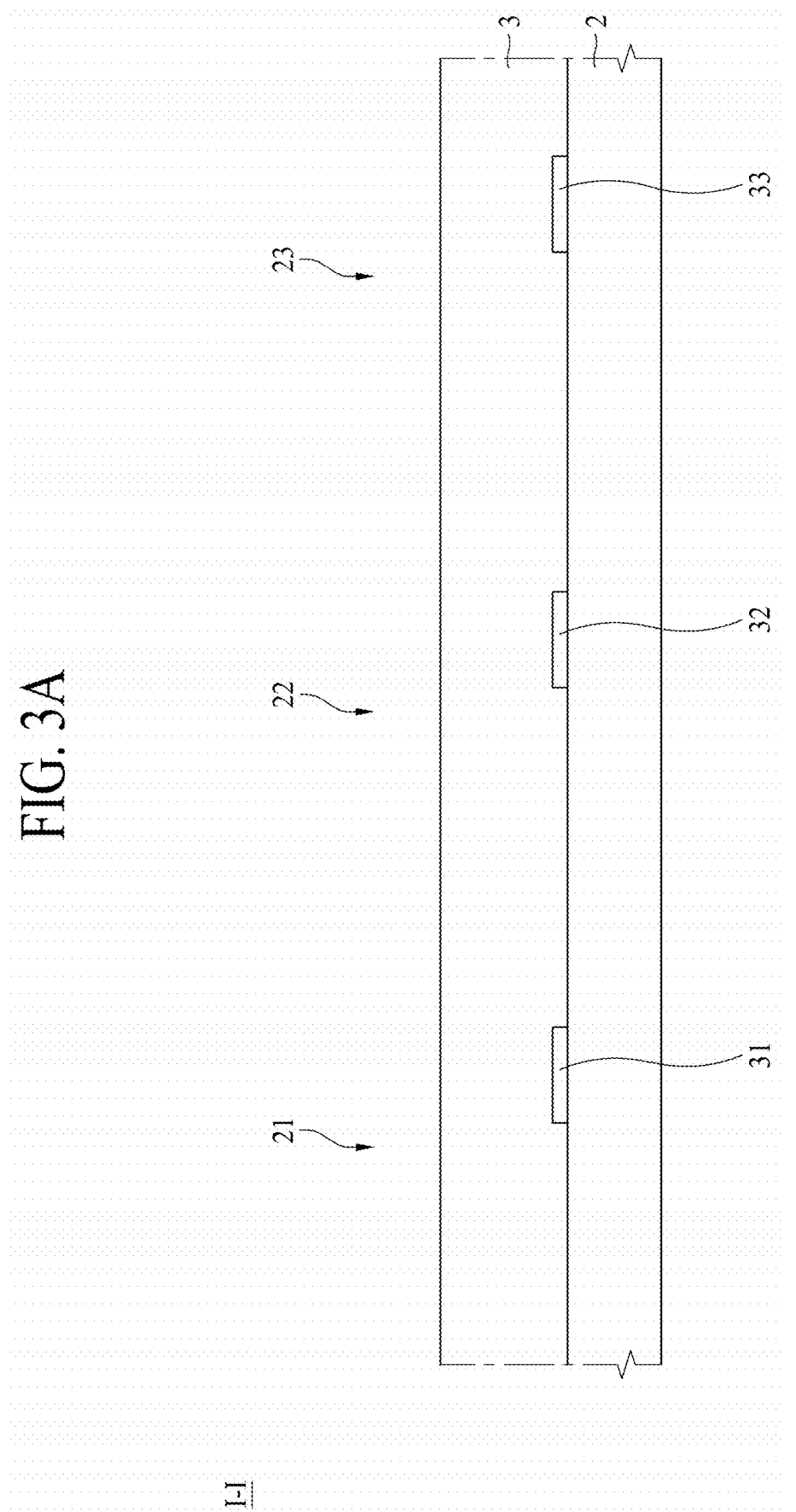

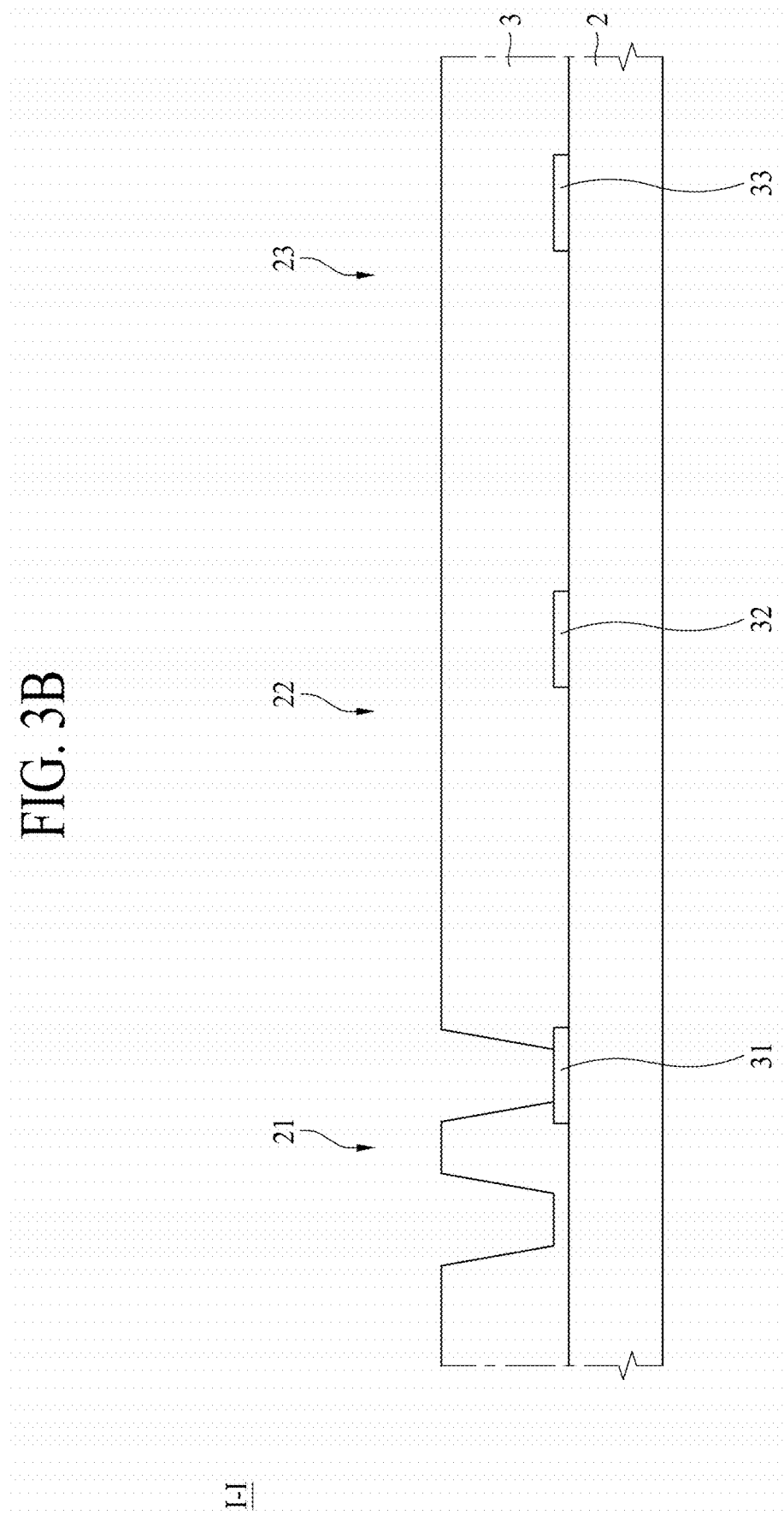

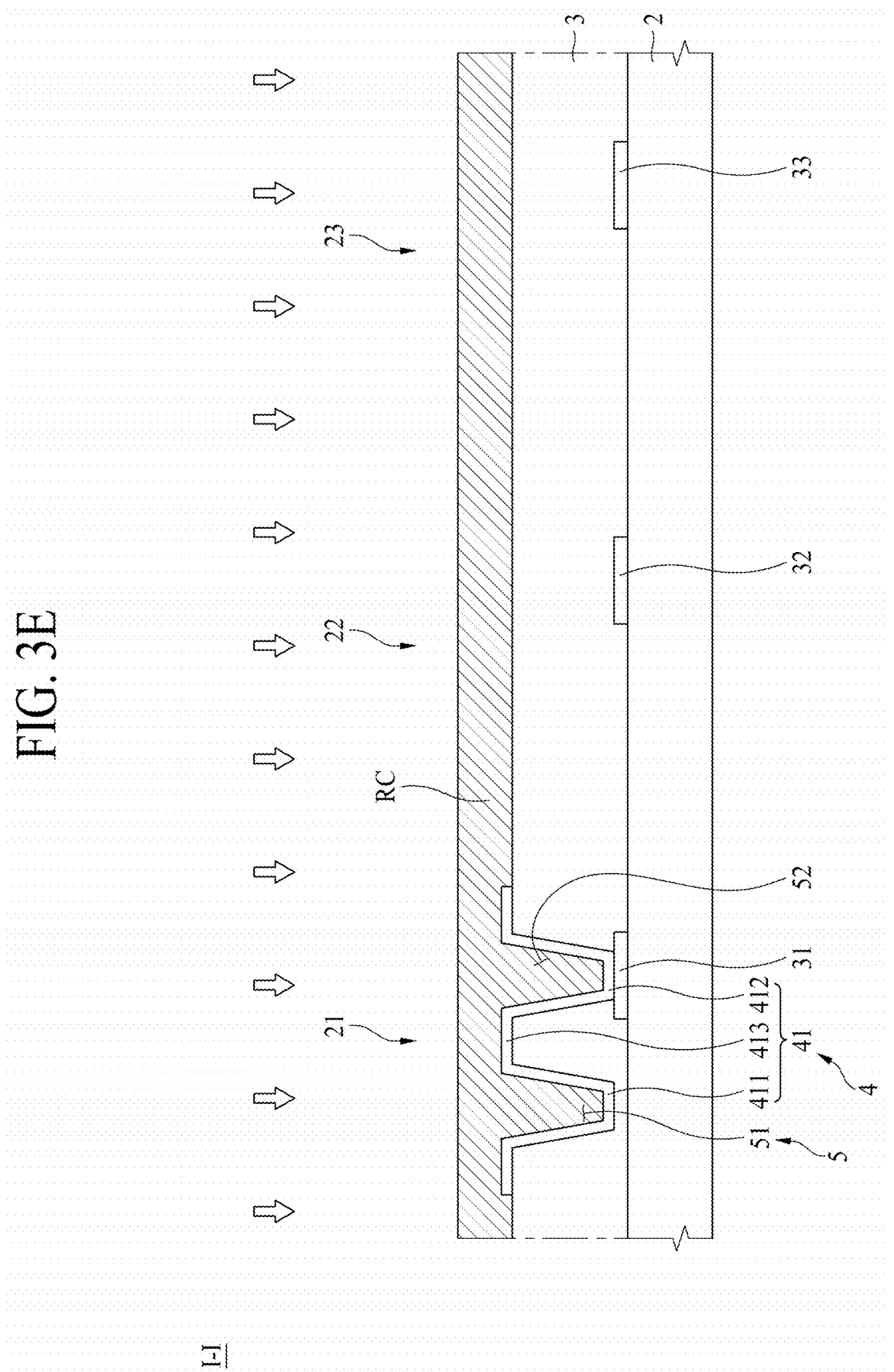

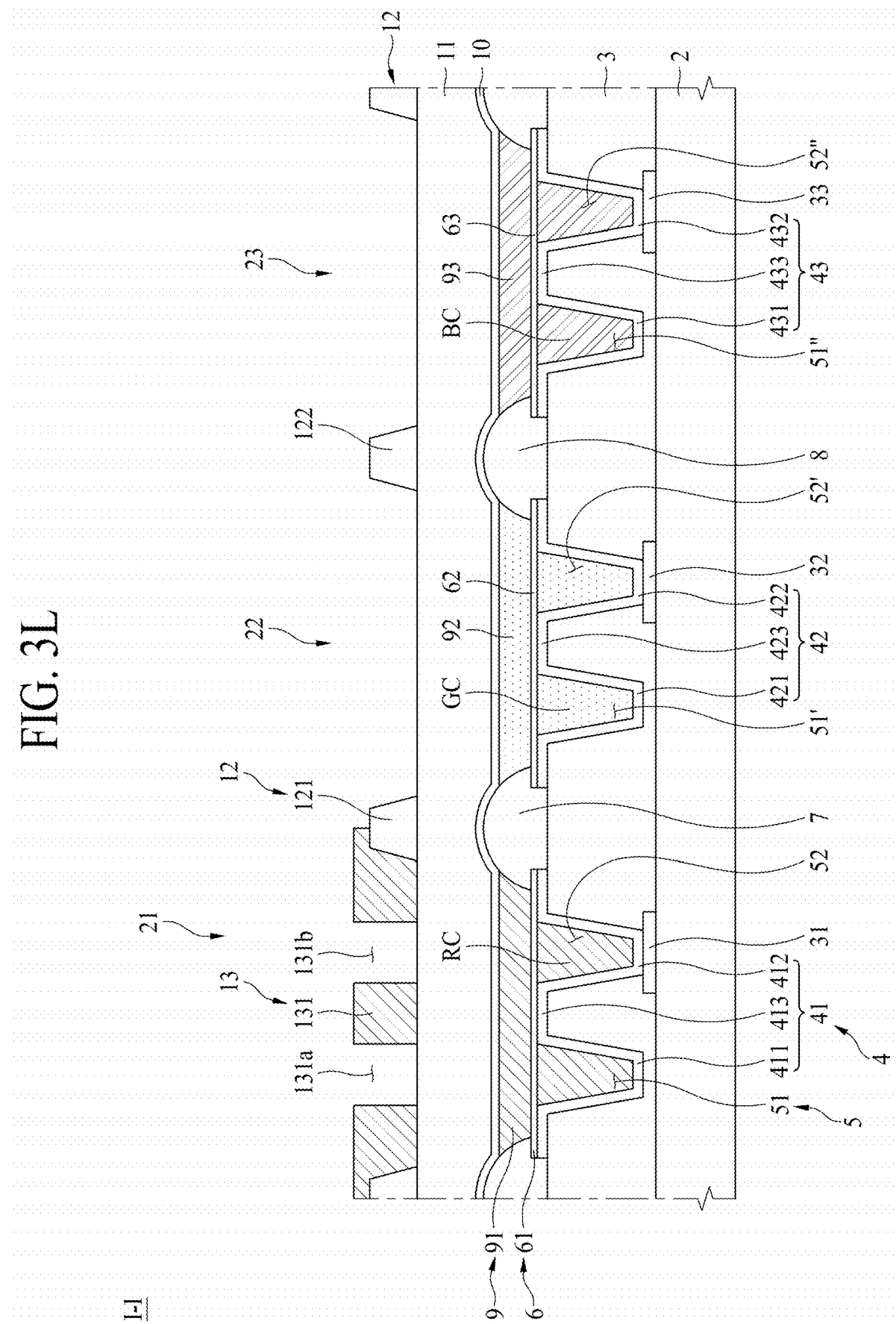

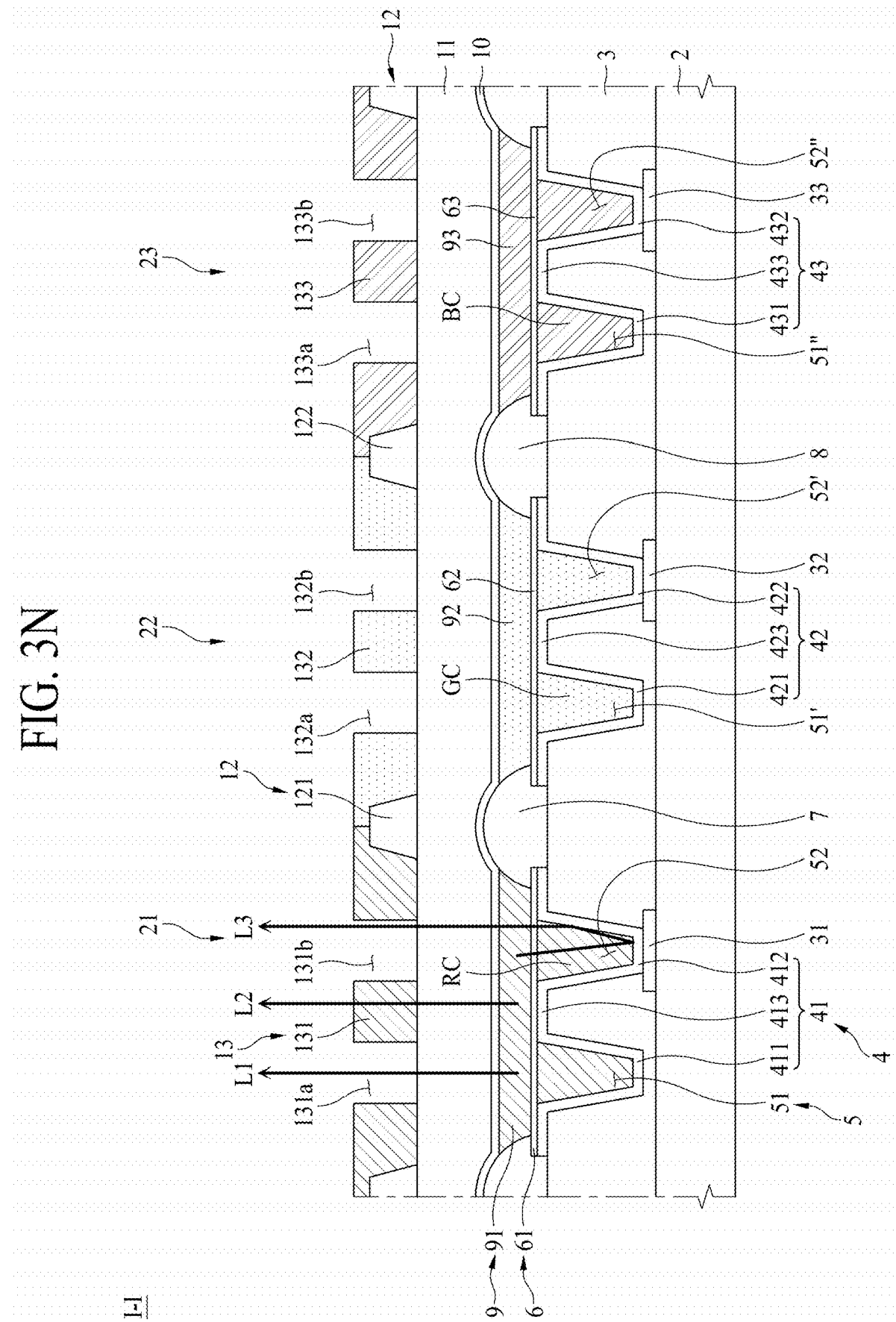

DISPLAY DEVICE

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, red, green and blue pixels of an organic light emitting layer are formed and then a polarizer POL is arranged thereon to prevent external light which is reflected from entering a user's eyes. However, if the polarizer POL is arranged on the organic light emitting layer, light emitted from the organic light emitting layer is partially shielded by the polarizer POL, whereby a problem occurs in that light transmittance is deteriorated. To solve this problem, a color filter instead of the polarizer POL is applied onto the organic light emitting layer. However, even in this case, there is a limitation in improving light transmittance due to the color filter. This problem occurs more seriously in case of a display device, which requires ultra-high resolution, such as a head mounted display.

SUMMARY

Accordingly, embodiments of the present disclosure are directed to a display device that substantially obviates one or more of the problems due to limitations and disadvantages of the related art.

An aspect of the present disclosure is to provide a display device that can improve transmittance of light emitted from an organic light emitting layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a first subpixel and a second subpixel, a circuit element layer provided on the substrate, including a first transistor provided on the first subpixel and a second transistor provided on the second subpixel, a first electrode provided on the substrate, including a first sub electrode connected to the first transistor and a second sub electrode connected with the second transistor, a transparent electrode including a first transparent electrode provided to cover the first sub electrode and a second transparent electrode provided to cover the second sub electrode, an organic light emitting layer including a first organic light emitting layer arranged on the first transparent electrode and a second organic light emitting layer arranged on the second transparent electrode, a second electrode arranged on the organic light emitting layer, an encapsulation layer arranged on the second electrode, a first black matrix arranged on the encapsulation layer, a first bank provided between the first transparent electrode and the second transparent electrode to partition the first subpixel and the second subpixel from each other, and a first color filter arranged to cover the first black matrix and the encapsulation layer to correspond to the first subpixel, wherein the first sub electrode includes a first pattern electrode formed inside the circuit element layer and a second pattern electrode spaced apart from the first pattern electrode, the first color filter includes a first transmissive hole arranged to correspond to the first pattern electrode and a second transmissive hole arranged to correspond to the second pattern electrode, and each of a first filling groove formed between the first pattern electrode and the first transparent electrode to correspond to the first transmissive hole and a second filling groove formed between the second pattern electrode and the first transparent electrode to correspond to the second transmissive hole is filled with a color member having the same color as that of the first color filter.

In the display device according to the present disclosure, after the color member is filled in a plurality of patterns formed in the first electrode, the color filter arranged on an area corresponding to the plurality of patterns is patterned to allow light emitted from the organic light emitting layer not to pass through the color filter, whereby light transmittance of the organic light emitting layer may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
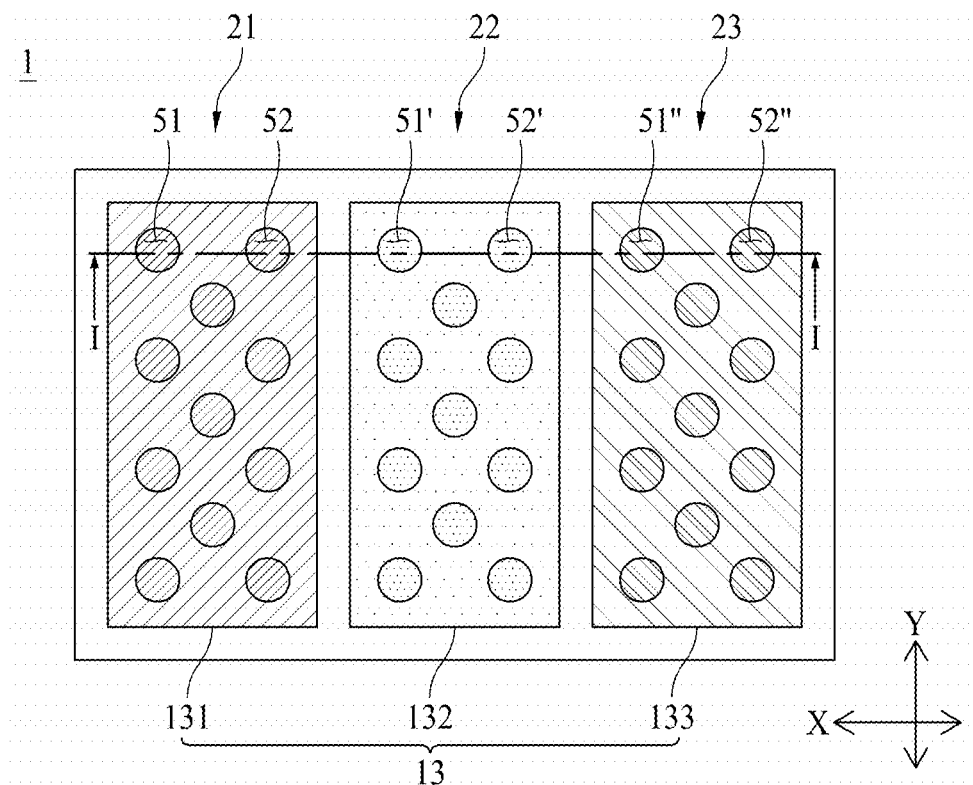
FIG. 1 is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 2:
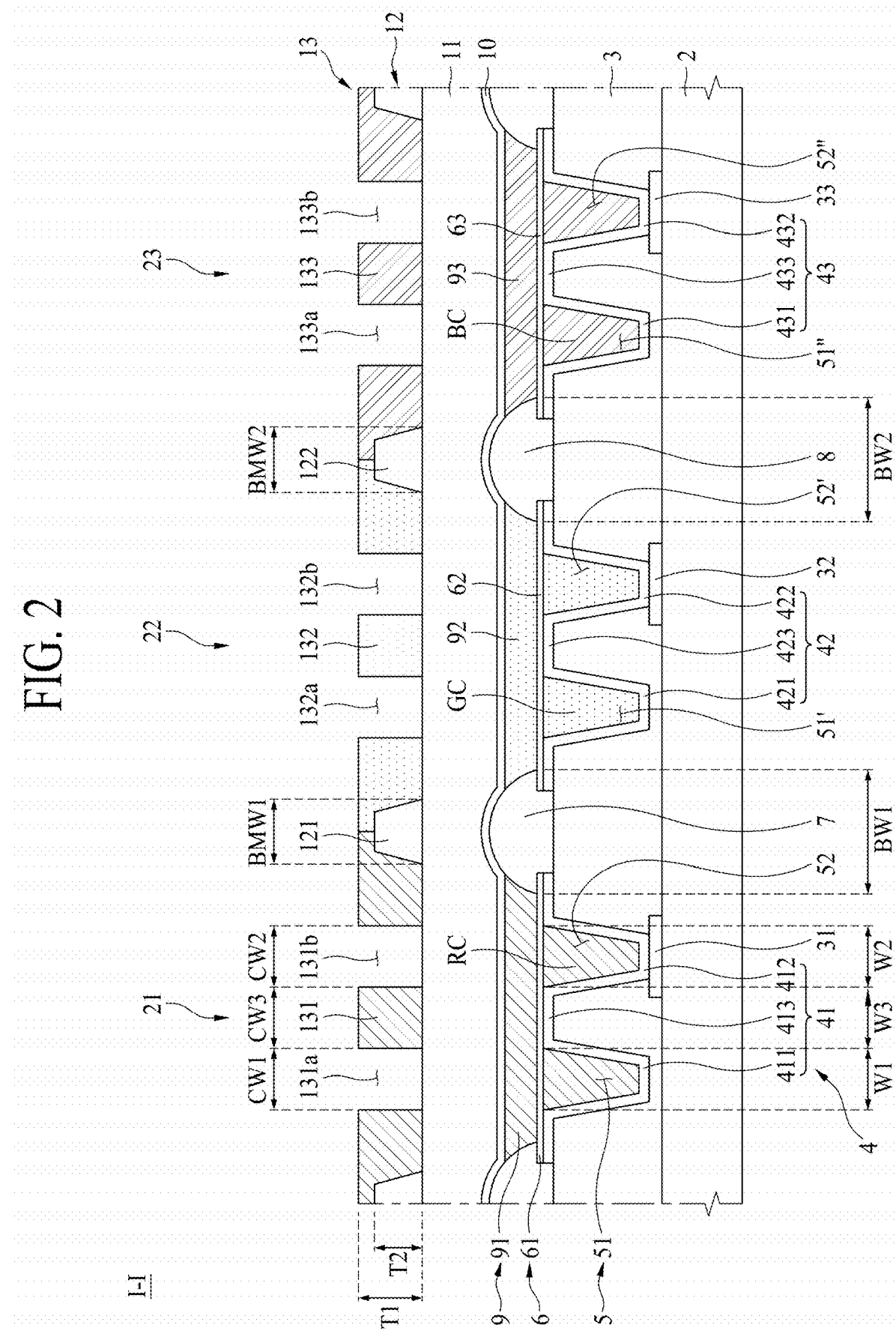
FIG. 2 is a brief cross-sectional view taken along line I-I shown in FIG. 1.

FIG. 1 is a brief plane view illustrating a display device according to one embodiment of the present disclosure, FIG. 2 is a brief cross-sectional view taken along line I-I shown in FIG. 1, and FIGS. 3A to 3N are cross-sectional views illustrating a brief manufacturing process of a display device according to one embodiment of the present disclosure.

With reference to FIGS. 1 to 3N, the display device 1 according to one embodiment of the present disclosure comprises a substrate 2, a circuit element layer 3, a first electrode 4, a filling groove 5, a transparent electrode 6, a first bank 7, a second bank 8, an organic light emitting layer 9, a second electrode 10, an encapsulation layer 11, a black matrix 12, and a color filter 13.

The substrate 2 may be a plastic film, a glass substrate, or a semiconductor substrate such as silicon. The substrate 2 may be made of a transparent material or an opaque material.

A first subpixel 21, a second subpixel 22 and a third subpixel 23 are provided on the substrate 2. The second subpixel 22 according to one example may be arranged to be adjacent to one side of the first subpixel 21. The third subpixel 23 according to one example may be arranged to be adjacent to one side of the second subpixel 22. Therefore, the first subpixel 21, the second subpixel 22 and the third subpixel 23 may sequentially be arranged on the substrate 2.

The first subpixel 21 may be provided to emit red (R) light, the second subpixel 22 may be provided to emit green (G) light, and the third subpixel 23 may be provided to emit blue (B) light, but these subpixels are not limited to this example and may emit light of various colors including white. Also, an arrangement sequence of the subpixels 21, 22 and 23 may be changed in various ways.

Each of the first subpixel 21, the second subpixel 22 and the third subpixel 23 may be provided with the first electrode 4, the filling groove 5, the transparent electrode 6, the organic light emitting layer 9, the second electrode 10, the encapsulation layer 11, and the color filter 12.

The display device 1 according to one embodiment of the present disclosure is provided in a top emission method in which light is emitted to a top portion, and therefore an opaque material as well as a transparent material may be used as a material of the substrate 2.

The circuit element layer 3 is arranged on one surface of the substrate 2.

A circuit element comprising a plurality of thin film transistors 31, 32 and 33, various types of signal lines, and a capacitor is provided on the circuit element layer 3 for each of the subpixels 21, 22 and 23. The signal lines may include gate lines, data lines, power lines and reference lines, and the thin film transistors 31, 32 and 33 may include a switching thin film transistor, a driving thin film transistor, and a sensing thin film transistor. The subpixels 21, 22 and 23 are defined by a crossing structure of gate lines and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 4.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first thin film transistor 31, a second thin film transistor 32 and a third thin film transistor 33 are arranged in the circuit element layer 3 separately for each of the subpixels 21, 22 and 23. The first thin film transistor 31 according to one example may be connected to a first sub electrode 41 arranged on the first subpixel 21 to apply a driving voltage for emitting light of a color corresponding to the first subpixel 21.

The second thin film transistor 32 according to one example may be connected to a second sub electrode 42 arranged on the second subpixel 22 to apply a driving voltage for emitting light of a color corresponding to the second subpixel 22.

The third thin film transistor 33 according to one example may be connected to a third sub electrode 43 arranged on the third subpixel 23 to apply a driving voltage for emitting light of a color corresponding to the third subpixel 23.

Each of the first subpixel 21, the second subpixel 22 and the third subpixel 23 according to one example supplies a predetermined current to an organic light emitting layer in accordance with the data voltage of the data line when a gate signal from the gate line is input thereto using each of the thin film transistors 31, 32 and 33. For this reason, the organic light emitting layer of each of the first subpixel 21, the second subpixel 22 and the third subpixel 23 may emit light with a predetermined brightness in accordance with the predetermined current.

The first electrode 4 is formed on the circuit element layer 3. The first electrode 4 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 4 may be an anode. The first electrode 4 may include a first sub electrode 41, a second sub electrode 42 and a third sub electrode 43.

The first sub electrode 41 may be provided on the first subpixel 21. The first sub electrode 41 may be formed over the inside and a top surface of the circuit element layer 3. The first sub electrode 41 is connected to a source electrode of the first thin film transistor 31 through a contact hole that passes through the circuit element layer 3.

The second sub electrode 42 may be provided on the second subpixel 22. The second sub electrode 42 may be formed over the inside and the top surface of the circuit element layer 3. The second sub electrode 42 is connected to a source electrode of the second thin film transistor 32 through a contact hole that passes through the circuit element layer 3.

The third sub electrode 43 may be provided on the third subpixel 23. The third sub electrode 43 may be formed over the inside and the top surface of the circuit element layer 3. The third sub electrode 43 is connected to a source electrode of the third thin film transistor 33 through a contact hole that passes through the circuit element layer 3.

In this case, the first to third thin film transistors 31, 32 and 33 may be N-type TFTs.

If the first to third thin film transistors 31, 32 and 33 are made of P-type TFTs, each of the first to third sub electrodes 41, 42 and 43 may be connected to a drain electrode of each of the first to third thin film transistors 31, 32 and 33.

In other words, each of the first to third sub electrodes 41, 42 and 43 may be connected to a source electrode or a drain electrode in accordance with types of the first to third thin film transistors 31, 32 and 33.

Since the display device 1 according to one embodiment of the present disclosure is provided in a top emission method, the first to third sub electrodes 41, 42 and 43 may include a reflective material for reflecting light emitted from the organic light emitting layer 9 to a top portion. In this case, the first to third sub electrodes 41, 42 and 43 may be made of a deposited structure of a transparent electrode formed of a transparent conductive material and a reflective electrode formed of the reflective material.

Since the first subpixel 21, the second subpixel 22 and the third subpixel 23 emit light of respective colors different from each other but have the same structure and shape, a description will be given based on the first subpixel 21.

With reference to FIG. 2, the first sub electrode 41 may include a first pattern electrode 411 formed inside the circuit element layer 3, and a second pattern electrode 412 spaced apart from the first pattern electrode 411.

The first pattern electrode 411 may be formed to be inserted into the circuit element layer 3 in a direction toward the substrate 2 from the top surface of the circuit element layer 3. For example, the first pattern electrode 411, as shown in FIG. 2, may be formed in, but not limited to, a trapezoidal shape having an opened side. The first pattern electrode 411 may be formed in another shape such as a rectangular shape having an opened side, which can reflect light emitted from the organic light emitting layer 6 toward the top portion.

The second pattern electrode 412 may be arranged to be spaced apart from the first pattern electrode 411. For example, the second pattern electrode 412 may be spaced apart from the first pattern electrode 411 in the same direction as a direction where the first subpixel 21 and the second subpixel 22 are arranged, for example, a first axis direction (X-axis direction shown in FIG. 1). The second pattern electrode 412 may be provided to be inserted into the circuit element layer 3 in the same manner as the first pattern electrode 411. At this time, the second pattern electrode 412 may have the same shape as that of the first pattern electrode 411.

The first sub electrode 41 may further include a planarization electrode 413 arranged between the first pattern electrode 411 and the second pattern electrode 412. The planarization electrode 413 may be formed on the circuit element layer 3 in a planarized shape unlike the first pattern electrode 411 and the second pattern electrode 412.

The first pattern electrode 411, the second pattern electrode 412 and the planarization electrode 413 may be connected with one another. Therefore, the first sub electrode 41, as shown in FIG. 2, may be formed in a shape of W. In this case, at least one of the first pattern electrode 411 and the second pattern electrode 412 may be in contact with the first thin film transistor 31. Therefore, the first pattern electrode 411, the second pattern electrode 412 and the planarization electrode 413 of the first sub electrode 41 may be supplied with a voltage applied from the first thin film transistor 31.

In the display device 1 according to one embodiment of the present disclosure, since the first and second pattern electrodes 411 and 412 are made of a metal material to be supplied with a voltage applied from the first thin film transistor 31, incident light emitted from the organic light emitting layer 9 may be reflected toward a top portion. Therefore, in the display device 1 according to one embodiment of the present disclosure, since a contact portion for connection to the first thin film transistor 31 may be used as a light emitting area, an aperture ratio may be improved and luminance may be improved.

The filling groove 5 is a groove filled with a color member, and may include a first filling groove 51 and a second filling groove 52. The first filling groove 51 may be formed by the first pattern electrode 411 and the transparent electrode 6. The second filling groove 52 may be formed by the second pattern electrode 412 and the transparent electrode 6.

In more detail, the transparent electrode 6 may include a first transparent electrode 61 arranged on the first subpixel 21 and a second transparent electrode 62 arranged on the second subpixel 22. The first transparent electrode 61 may be provided to cover the first sub electrode 41, and the second transparent electrode 62 may be provided to cover the second sub electrode 42.

Therefore, the first filling groove 51 may be surrounded by the first pattern electrode 411 and the first transparent electrode 61, and the second filling groove 52 may be surrounded by the second pattern electrode 412 and the first transparent electrode 61. That is, the first filling groove 51 may be formed between the first pattern electrode 411 and the first transparent electrode 61, and the second filling groove 52 may be formed between the second pattern electrode 412 and the first transparent electrode 61.

The first filling groove 51 and the second filling groove 52 may be formed in the same shape. For example, the first filling roove 51 and the second filling groove 52 may be formed in a rectangular shape or a trapezoidal shape. The shape of the first filling groove 51 may be determined by the first pattern electrode 411 and the first transparent electrode 61, which surround the first filling groove 51. Likewise, the shape of the second filling groove 52 may be determined by the second pattern electrode 412 and the first transparent electrode 61, which surround the second filling groove 52.

Each of the first filling groove 51 and the second filling groove 52 may be filled with a color member of the same color as that of light emitted from the first subpixel 21. As shown in FIG. 2, each of the first filling groove 51 and the second filling groove 52 may be filled with a color member having the same color as that of a first color filter 131, for example, a red color member RC. In this case, the color member filled in the filling groove 5 of each of the subpixels 21, 22 and 23 may be made of the same material as that of each of the first to third color filters 131, 132 and 133. For example, the color member may be a polymer material.

In the display device 1 according to one embodiment of the present invention, as each of the first filling groove 51 and the second filling groove 52 is filled with a color member having the same color as that of the first color filter 131, luminance or color reproduction of the first subpixel 21 may be enhanced without unfamiliarity for red light emitted from the organic light emitting layer 6 of the first subpixel 21.

As described above, the first transparent electrode 61 may be arranged to cover the first sub electrode 41. In more detail, the first transparent electrode 61 may cover the first pattern electrode 411, the second pattern electrode 412 and the planarization electrode 413 to be in contact with each of the first pattern electrode 411, the second pattern electrode 412 and the planarization electrode 413. Therefore, the first transparent electrode 61 may be made of a metal material. Therefore, the first transparent electrode 61 may be supplied with a voltage applied from the first thin film transistor 31 through at least one of the first pattern electrode 411, the second pattern electrode 412 and the planarization electrode 413.

Meanwhile, since the first filling groove 51 surrounded by the first pattern electrode 411 is filled with the red color member RC, the first transparent electrode 61 may be arranged to adjoin the red color member RC filled in the first filling groove 51. Likewise, since the second filling groove 52 surrounded by the second pattern electrode 412 is filled with the red color member RC, the first transparent electrode 61 may be arranged to adjoin the red color member RC filled in the second filling groove 52. Therefore, as shown in FIG. 2, the first transparent electrode 61 may have a profile almost parallel with a top surface of the substrate 2.

Therefore, in the display device 1 according to one embodiment of the present invention, since the first transparent electrode 61 may be arranged in parallel with the second electrode 10 which will be described later, an electric field may uniformly be formed between the first transparent electrode 61 and the second electrode 10 even though the first sub electrode 41 is formed in a shape of W, whereby luminance may be prevented from being non-uniform on the first and second pattern electrodes 411 and 412 and the planarization electrode 413.

As shown in FIG. 2, the second sub electrode 42 arranged on the second subpixel 22 may include a first pattern electrode 421, a second pattern electrode 422, and a planarization electrode 423. The first pattern electrode 421, the second pattern electrode 422 and the planarization electrode 423 may be provided in the same shape as the first pattern electrode 411, the second pattern electrode 412 and the planarization electrode 413 of the first sub electrode 41 to serve as the same function as the first pattern electrode 411, the second pattern electrode 412 and the planarization electrode 413 of the first sub electrode 41.

Also, the second transparent electrode 62 arranged on the second subpixel 22 may be provided to cover the second sub electrode 42, a first filling groove 51' may be formed between the first pattern electrode 421 and the second transparent electrode 62, and a second filling groove 52' may be formed between the second pattern electrode 422 and the second transparent electrode 62. Each of the first filling groove 51' and the second filling groove 52' of the second subpixel 22 may be filled with a color member of the same color as that of a second color filter 132 arranged on the second subpixel 22, for example, a green color member GC.

Therefore, in the display device 1 according to one embodiment of the present invention, since the second transparent electrode 62 may be arranged in parallel with the second electrode 10 which will be described later, an electric field may uniformly be formed between the second transparent electrode 62 and the second electrode 10 even though the second sub electrode 42 is formed in a shape of W, whereby luminance may be prevented from being non-uniform on the first and second pattern electrodes 421 and 422 and the planarization electrode 423.

Likewise, as shown in FIG. 2, the third sub electrode 43 arranged on the third subpixel 23 may include a first pattern electrode 431, a second pattern electrode 432, and a planarization electrode 433. The first pattern electrode 431, the second pattern electrode 432 and the planarization electrode 433 may be provided in the same shape as the first pattern electrode 411, the second pattern electrode 412 and the planarization electrode 413 of the first sub electrode 41 to serve as the same function as the first pattern electrode 411, the second pattern electrode 412 and the planarization electrode 413 of the first sub electrode 41.

Also, the third transparent electrode 63 arranged on the third subpixel 23 may be provided to cover the third sub electrode 43, a first filling groove 51" may be formed between the first pattern electrode 431 and the third transparent electrode 63, and a second filling groove 52" may be formed between the second pattern electrode 432 and the third transparent electrode 63. Each of the first filling groove 51" and the second filling groove 52" of the third subpixel 23 may be filled with a color member of the same color as that of a third color filter 133 arranged on the third subpixel 23, for example, a blue color member BC.

Therefore, in the display device 1 according to one embodiment of the present invention, since the third transparent electrode 63 may be arranged in parallel with the second electrode 10 which will be described later, an electric field may uniformly be formed between the third transparent electrode 63 and the second electrode 10 even though the third sub electrode 43 is formed in a shape of W, whereby luminance may be prevented from being non-uniform on the first and second pattern electrodes 431 and 432 and the planarization electrode 433.

With reference to FIG. 2 again, the first bank 7 is provided between the first transparent electrode 61 and the second transparent electrode 62. The first bank 7 according to one example is to partition the first subpixel 21 and the second subpixel 22 from each other. The first bank 7 may be provided to cover an edge of each of the first transparent electrode 61 and the second transparent electrode 62, thereby partitioning the first subpixel 21 and the second subpixel 22 from each other.

Since both ends of the first transparent electrode 61 are matched with both ends of the first sub electrode 41 and both ends of the second transparent electrode 62 are matched with both ends of the second sub electrode 42, the first bank 7 may cover edges of the first sub electrode 41 and the second sub electrode 42 as well as the edges of the first transparent electrode 61 and the second transparent electrode 62.

The first bank 7 serves to define a subpixel, that is, a light emitting area. Also, an area where the first bank 7 is formed may be defined as a non-light emitting area because the area does not emit light. The first bank 7 may be formed of an organic film such as acryl resin, epoxy resin, phenolic resin, polyamide resin, and polyimide resin. The organic light emitting layer 9 is formed on the first transparent electrode 61 and the first bank 7.

With reference to FIG. 2, the first bank 7 may be formed in a semi-spherical shape. An outer surface of the first bank 7 and a top surface of the first sub electrode 41 may form a predetermined angle. The predetermined angle may be 50° or more and less than 90° as a width of the bank becomes narrow in accordance with high resolution of the display device. A width of the bank may become narrow as the distance between subpixels becomes narrow.

Likewise, the outer surface of the first bank 7 and a top surface of the second sub electrode 42 may form a predetermined angle. The predetermined angle may be equal to the angle between the outer surface of the first bank 7 and the top surface of the first sub electrode 41.

The second bank 8 is provided between the second transparent electrode 62 and the third transparent electrode 63. The second bank 8 according to one example may be provided to cover an edge of each of the second transparent electrode 62 and the third transparent electrode 63, thereby partitioning the second subpixel 22 and the third subpixel 23 from each other. The second bank 8 may also cover edges of the second sub electrode 42 and the third sub electrode 43.

The second bank 8 serves to define a subpixel, that is, a light emitting area. Also, an area where the second bank 8 is formed may be defined as a non-light emitting area because the area does not emit light. The second bank 8 may be formed of the same material as that of the first bank 7. The organic light emitting layer 9 is formed on the second transparent electrode 62 and the second bank 8.

The second bank 8 may be in the same semi-spherical shape as that of the first bank 7. An outer surface of the second bank 8 and a top surface of the second sub electrode 42 may form a predetermined angle. The predetermined angle may be 50° or more and less than 90° as a width of the bank becomes narrow in accordance with high resolution of the display device.

Also, the outer surface of the second bank 8 and a top surface of the third sub electrode 43 may form a predetermined angle. The predetermined angle may be equal to the angle between the outer surface of the second bank 8 and the top surface of the second sub electrode 42.

The organic light emitting layer 9 is arranged on the transparent electrode 6. The organic light emitting layer 9 according to one example may include a hole transporting layer HTL, a light emitting layer EML, a hole blocking layer HBL, and an electron transporting layer ETL. The organic light emitting layer 9 may further include a hole injecting layer HIL, an electron blocking layer EBL, and an electron injecting layer EIL.

The hole injecting layer HIL, the hole transporting layer HTL, the electron transporting layer ETL, and the electron injecting layer EIL of the organic light emitting layer 9 are intended to improve emission efficiency of the light emitting layer EML. The hole transporting layer HTL and the electron transporting layer ETL are intended to maintain a balance between electrons and holes, and the hole injecting layer HIL and the electron injecting layer ETL are intended to enhance injection of electrons and holes.

In more detail, the hole injecting layer HIL may facilitate injection of holes by lowering an injection energy barrier of a hole injected from an anode material. The hole transporting layer HTL serves to transport the holes injected from an anode to the light emitting layer without loss.

The light emitting layer EML is a layer for emitting light through recombination of holes injected from an anode and electrons injected from a cathode, and may emit light of red, blue and green colors in accordance with combination energy inside the light emitting layer and form a white light emitting layer by configuring a plurality of light emitting layers. The hole blocking layer HBL may be provided between the light emitting layer EML and the electron transporting layer ETL to block movement of holes which are not combined with electrons in the light emitting layer EML. The electron blocking layer EBL is provided between the light emitting layer EML and the hole transporting layer HTL and serves to lock up electrons in the light emitting layer EML to allow the electrons not to move from the light emitting layer EML to the hole transporting layer HTL.

The electron transporting layer ETL serves to transport the electrons injected from the cathode to the light emitting layer. The electron injecting layer EIL serves to facilitate injection of the electrons from the cathode by lowering a potential barrier during injection of the electrons.

If a high potential voltage is applied to the first electrode 4 and a low potential voltage is applied to the second electrode 10, holes and electrons are moved to the light emitting layer through the hole transporting layer and the electron transporting layer, respectively and combined with each other in the light emitting layer to emit light.

The organic light emitting layer 9 may include a first organic light emitting layer 91, a second organic light emitting layer 92 and a third organic light emitting layer 93. The first organic light emitting layer 91, the second organic light emitting layer 92 and the third organic light emitting layer 93 may be provided in one pixel. In this case, one pixel may mean, but is not limited to, a pixel capable of embodying white light by combination of red light, green light and blue light.

As described above, each of the first to third organic light emitting layers 91, 92 and 93 may include a hole injecting layer, a hole transporting layer, an electron blocking layer, a light emitting layer, a hole blocking layer, an electron transporting layer, and an electron injecting layer.

The first organic light emitting layer 91 may be arranged on the first transparent electrode 61. The first organic light emitting layer 91 may be formed on the first transparent electrode 61 after the first transparent electrode 61, the first bank 7 and the second bank 8 are formed. At this time, the first organic light emitting layer 91 may be patterned to be arranged on only the first subpixel 21. Therefore, as shown in FIG. 2, the first organic light emitting layer 91 may be arranged on only the first transparent electrode 61 and thus spaced apart from the second organic light emitting layer 92.

The second organic light emitting layer 92 may be arranged on the second transparent electrode 62. The second organic light emitting layer 92 may be formed on the second transparent electrode 62 after the second transparent electrode 62, the first bank 7 and the second bank 8 are formed. At this time, the second organic light emitting layer 92 may be patterned to be arranged on only the second subpixel 22. Therefore, as shown in FIG. 2, the second organic light emitting layer 92 may be arranged on only the second transparent electrode 62 and thus spaced apart from each of the first organic light emitting layer 91 and the third organic light emitting layer 93.

The third organic light emitting layer 93 may be arranged on the third transparent electrode 63. The third organic light emitting layer 93 may be formed on the third transparent electrode 63 after the third transparent electrode 63, the first bank 7 and the second bank 8 are formed. At this time, the third organic light emitting layer 93 may be patterned to be arranged on only the third subpixel 23. Therefore, as shown in FIG. 2, the third organic light emitting layer 93 may be arranged on only the third transparent electrode 63 and thus spaced apart from each of the first organic light emitting layer 91 and the second organic light emitting layer 92.

Therefore, in the display device 1 according to one embodiment of the present disclosure, as shown in FIG. 2, the first organic light emitting layer 91 arranged to be patterned on the first subpixel 21, the second organic light emitting layer 92 arranged to be patterned on the second subpixel 22, and the third organic light emitting layer 93 arranged to be patterned on the third subpixel 23 may be arranged to be spaced apart from one another to emit light of different colors for each of the first to third subpixels 21, 22 and 23.

For example, the first subpixel 21 may be provided to emit red (R) light, the second subpixel 22 may be provided to emit green (G) light, and the third subpixel 23 may be provided to emit blue (B) light. However, without limitation to this example, the first to third subpixels 21, 22 and 23 may be provided to emit light of various colors.

With reference to FIG. 2 again, the second electrode 10 is arranged on the organic light emitting layer 9. The second electrode 10 according to one embodiment is a common layer commonly formed on the first subpixel 21, the second subpixel 22 and the third subpixel 23. The second electrode 10 may be formed of a transparent conductive material (TCO) such as ITO and IZO, which can transmit light, or may be formed of a semi-transmissive conductive material such as Mg, Ag, or Alloy of Mg and Ag.

The encapsulation layer 11 may be formed on the second electrode 10. The encapsulation layer 11 serves to prevent oxygen or water from being permeated into the organic light emitting layer 9 and the second electrode 10. To this end, the encapsulation layer 11 may include at least one inorganic film and at least one organic film.

For example, the encapsulation layer 11 may include a first inorganic film, an organic film, and a second inorganic film. In this case, the first inorganic film is formed to cover the second electrode 10. The organic film is formed to cover the first inorganic film. It is preferable that the organic film is formed at a length long enough to prevent particles from being permeated into the organic light emitting layer 9 and the second electrode 10 by passing through the first inorganic film. The second inorganic film is formed to cover the organic film.

The black matrix 12 may be formed on the encapsulation layer 11. The black matrix 12 is to prevent a color mixture between adjacent subpixels. In more detail, the black matrix 12 may be made of a material that absorbs light to prevent light emitted from each subpixel from being interfered with an adjacent subpixel, whereby a color mixture may be avoided.

The black matrix 12 may include a first black matrix 121 and a second black matrix 122. The first black matrix 121 may be arranged to correspond to the first bank 7, and the second black matrix 122 may be arranged to correspond to the second bank 8. Therefore, the first black matrix 121 may prevent a color mixture between the first subpixel 21 and the second subpixel 22 from occurring, and the second black matrix 122 may prevent a color mixture between the second subpixel 22 and the third subpixel 23 from occurring.

The color filter 13 is to filter light of the other colors except colors of light emitted from the organic light emitting layers 91, 92 and 93 of the respective subpixels 21, 22 and 23. That is, the color filter 13 may transmit only a color of light emitted from each of the organic light emitting layers 91, 92 and 93. The color filter 13 may include a first color filter 131 arranged on the first subpixel 21 to transmit only a color of light emitted from the first organic light emitting layer 91, a second color filter 132 arranged on the second subpixel 22 to transmit only a color of light emitted from the second organic light emitting layer 92, and a third color filter 133 arranged on the third subpixel 23 to transmit only a color of light emitted from the third organic light emitting layer 93.

For example, the first color filter 131 may be a red color filter for transmitting only red light, the second color filter 132 may be a green color filter for transmitting only green light, and the third color filter 133 may be a blue color filter for transmitting only blue light.

In this case, since each of the first to third color filters 131, 132 and 133 may transmit light of a narrower wavelength area range corresponding to a middle range of a wavelength area range of light emitted from the corresponding organic light emitting layer, a color reproduction rate of red, green and blue colors of the respective subpixels 21, 22 and 23 may be improved. In this case, the middle range means a wavelength area range close to a pure color.

As a result, in the display device 1 according to one embodiment of the present disclosure, since each of the first to third color filters 131, 132 and 133 may transmit only light corresponding to a partial range of a wavelength area range of light emitted from the corresponding organic light emitting layer in addition to the case that the first to third organic light emitting layers 91, 92 and 93 respectively arranged on the subpixels 21, 22 and 23 respectively emit red light, green light and blue light, a color reproduction rate may be more improved to be close to a pure red, green and blue colors than the case that the color filter is not provided.

However, as the first to third color filters 131, 132 and 133 are respectively arranged on the first to third organic light emitting layers 91, 92 and 93, a color reproduction rate may be enhanced but a problem may occur in that luminance is lowered by deterioration of light transmittance due to filtering of the color filter.

To solve this problem, in the display device 1 according to one embodiment of the present disclosure, a transmissive hole through which light passes may be provided in the color filter such that light emitted from each of the light emitting layers 91, 92 and 93 may be emitted to the outside without being filtered by the color filter, that is, without passing through the inside of the color filter.

With reference to FIG. 2, the first color filter 131 arranged on the first subpixel 21 may include a first transmissive hole 131a and a second transmissive hole 131b. The first transmissive hole 131a may be formed in the first color filter 131 to correspond to the first pattern electrode 411. The first transmissive hole 131a may be formed by removing the first color filter 131 arranged in the position corresponding to the first pattern electrode 411.

The second transmissive hole 131b may be formed in the first color filter 131 to correspond to the second pattern electrode 412. The second transmissive hole 131b may be formed by removing the first color filter 131 arranged in the position corresponding to the second pattern electrode 412.

Therefore, on the plane as shown in FIG. 1, at least one of the first organic light emitting layer 91 arranged below the encapsulation layer 11 and the color member filled in the first filling groove 51 may be seen through the first transmissive hole 131a, and at least one of the first organic light emitting layer 91 arranged below the encapsulation layer 11 and the color member filled in the second filling groove 52 may be seen through the second transmissive hole 131b.

Since the first color filter 131, the color member filled in the first filling groove 51 and the color member filled in the second filling groove 52 have the same color, a user may recognize a color of light emitted from the first subpixel 21, for example, red light without unfamiliarity.

The second color filter 132 arranged on the second subpixel 22 may include a first transmissive hole 132a and a second transmissive hole 132b. The first transmissive hole 132a may be formed in the second color filter 132 to correspond to the first pattern electrode 421. The first transmissive hole 132a may be formed by removing the second color filter 132 arranged in the position corresponding to the first pattern electrode 421.

The second transmissive hole 132b may be formed in the second color filter 132 to correspond to the second pattern electrode 422. The second transmissive hole 132b may be formed by removing the second color filter 132 arranged in the position corresponding to the second pattern electrode 422.

Therefore, on the plane as shown in FIG. 1, at least one of the second organic light emitting layer 92 arranged below the encapsulation layer 11 and the color member filled in the first filling groove 51' may be seen through the first transmissive hole 132a, and at least one of the second organic light emitting layer 92 arranged below the encapsulation layer 11 and the color member filled in the second filling groove 52' may be seen through the second transmissive hole 132b.

Since the second color filter 132, the color member filled in the first filling groove 51' and the color member filled in the second filling groove 52' have the same color, a user may recognize a color of light emitted from the second subpixel 22, for example, green light without unfamiliarity.

The third color filter 133 arranged on the third subpixel 23 may include a first transmissive hole 133a and a second transmissive hole 133b. The first transmissive hole 133a may be formed in the third color filter 133 to correspond to the first pattern electrode 431. The first transmissive hole 133a may be formed by removing the third color filter 133 arranged in the position corresponding to the first pattern electrode 431.

The second transmissive hole 133b may be formed in the third color filter 133 to correspond to the second pattern electrode 432. The second transmissive hole 133b may be formed by removing the third color filter 133 arranged in the position corresponding to the second pattern electrode 432.

Therefore, on the plane as shown in FIG. 1, at least one of the third organic light emitting layer 93 arranged below the encapsulation layer 11 and the color member filled in the first filling groove 51" may be seen through the first transmissive hole 133a, and at least one of the third organic light emitting layer 93 arranged below the encapsulation layer 11 and the color member filled in the second filling groove 52" may be seen through the second transmissive hole 133b.

Since the third color filter 133, the color member filled in the first filling groove 51" and the color member filled in the second filling groove 52" have the same color, a user may recognize a color of light emitted from the third subpixel 23, for example, blue light without unfamiliarity.

In the display device 1 according to one embodiment of the present invention, with reference to the first subpixel 21 for example, after the red color member RC is filled in each of the first filling groove 51 formed by the first pattern electrode 411 of the first sub electrode 41 and the second filling groove 52 formed by the second pattern electrode 412, the first color filter 131 arranged in the position corresponding to each of the first filling groove 51 and the second filling groove 52 is removed to form the first transmissive hole 131a and the second transmissive hole 131b, whereby the red light emitted from the first organic light emitting layer 91 may partially be emitted through the first transmissive hole 131a and the second transmissive hole 131b without passing through the first color filter 131.

Therefore, in the display device 1 according to one embodiment of the present disclosure, the red light emitted from the first organic light emitting layer 91 may partially pass through the first transmissive hole 131a and the second transmissive hole 131b to enhance its transmittance, whereby luminance may be improved. The other red light may pass through the first color filter 131 which is the red color filter, whereby a color reproduction rate may be improved.

Also, in the display device 1 according to one embodiment of the present disclosure, since the first pattern electrode 411 and the second pattern electrode 412 of the first sub electrode 41 may reflect red light, which is emitted from the first organic light emitting layer 91 to a lower side, toward an upper side, the first pattern electrode 411 and the second pattern electrode 412 may be used as light emitting areas to enhance an aperture ratio, whereby luminance may be more improved.

Meanwhile, as the second subpixel 22 and the third subpixel 23 may also be provided in the same structure as that of the first subpixel 21, the display device 1 according to one embodiment of the present disclosure may improve a color reproduction rate and transmittance of green light of the second subpixel 22 and also improve a color reproduction rate and transmittance of blue light of the third subpixel 23.

FIGS. 3A to 3N are cross-sectional views illustrating a brief manufacturing process of a display device according to one embodiment of the present disclosure. In the display device 1 according to one embodiment of the present disclosure, through the following manufacturing process step, after the first and second pattern electrodes 411 and 412 of the first sub electrode 41 and the first and second filling grooves 51 and 52 are formed and the color member of the same color as that of light emitted from the first subpixel 21 is filled in each of the first filling groove 51 and the second filling groove 52, the first transmissive hole 131a and the second transmissive hole 131b of the first color filter 131 may be formed in the position corresponding to each of the first pattern electrode 411 and the second pattern electrode 412. Likewise, the second subpixel 22 and the third subpixel 23 may be manufactured in the same manner as the manufacturing process of the first subpixel 21.

With reference to FIG. 3A, the first to third thin film transistors 31, 32 and 33 are arranged on the substrate 2 to respectively correspond to the first to third subpixels 21, 22 and 23 and then the circuit element layer 3 is coated. The circuit element layer 3 may be, but not limited to, an overcoat layer.

Next, with reference to FIG. 3B, the circuit element layer 3 is patterned on the position where the first pattern electrode 411 and the second pattern electrode 412 will be formed. This process may be performed through an etching method such as dry etching after the position to be patterned is subjected to exposure. At this time, the circuit element layer 3 may be etched until the top surface of the first thin film transistor 31 is exposed.

Figure 3C:
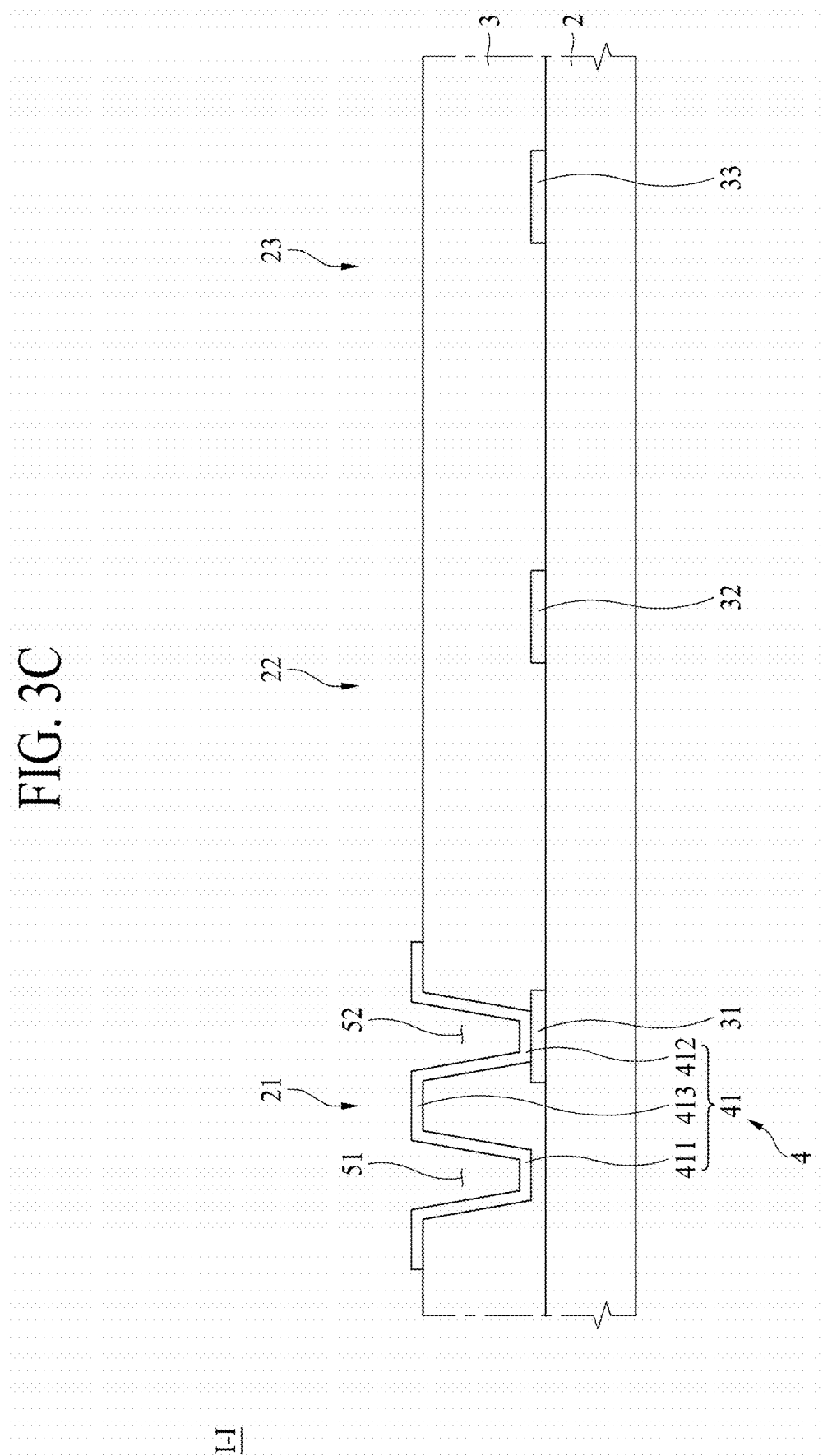
FIGS. 3A to 3N are cross-sectional views illustrating a brief manufacturing process of a display device according to one embodiment of the present disclosure.

Next, with reference to FIG. 3C, after the first sub electrode 41 is deposited on not only the top surface of the circuit element layer 3 but also the portion patterned during the process of FIG. 3B, both ends of the first sub electrode 41 are patterned such that the first sub electrode 41 is arranged on only the first subpixel 21. Therefore, the first pattern electrode 411 and the second pattern electrode 412 may be arranged in the patterned portion, that is, inside the circuit element layer 3, and the planarization electrode 413 may be arranged on the top surface of the circuit element layer 3. In this case, the second pattern electrode 412 may be in contact with the first thin film transistor 31. Although FIG. 3C illustrates that the second pattern electrode 412 is in contact with the first thin film transistor 31, the present disclosure is not limited to the example of FIG. 3C. That is, the first pattern electrode 411 may be in contact with the first thin film transistor 31, or both the first pattern electrode 411 and the second pattern electrode 412 may be in contact with the first thin film transistor 31.

Figure 3D:
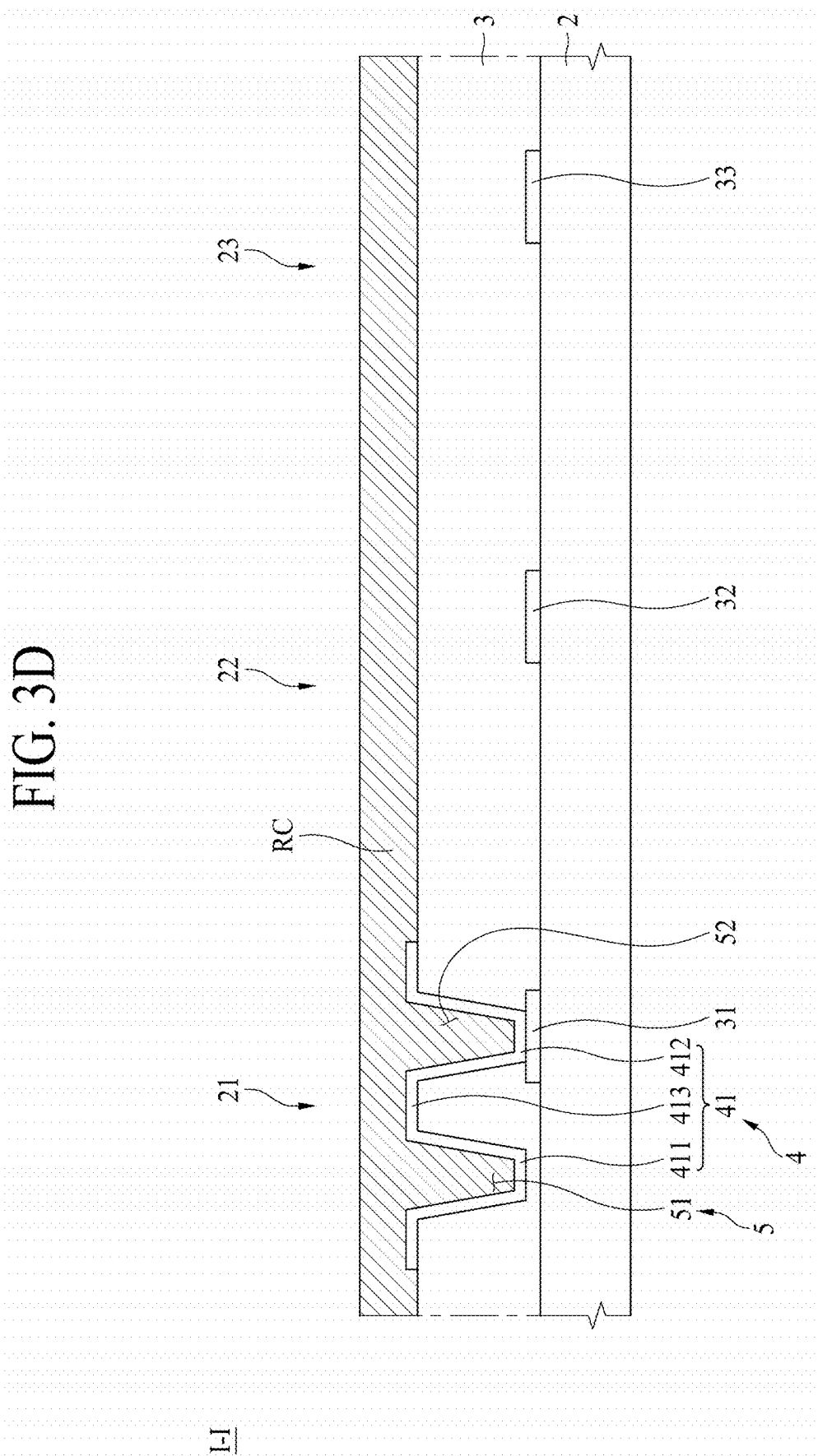
Figure 3F:
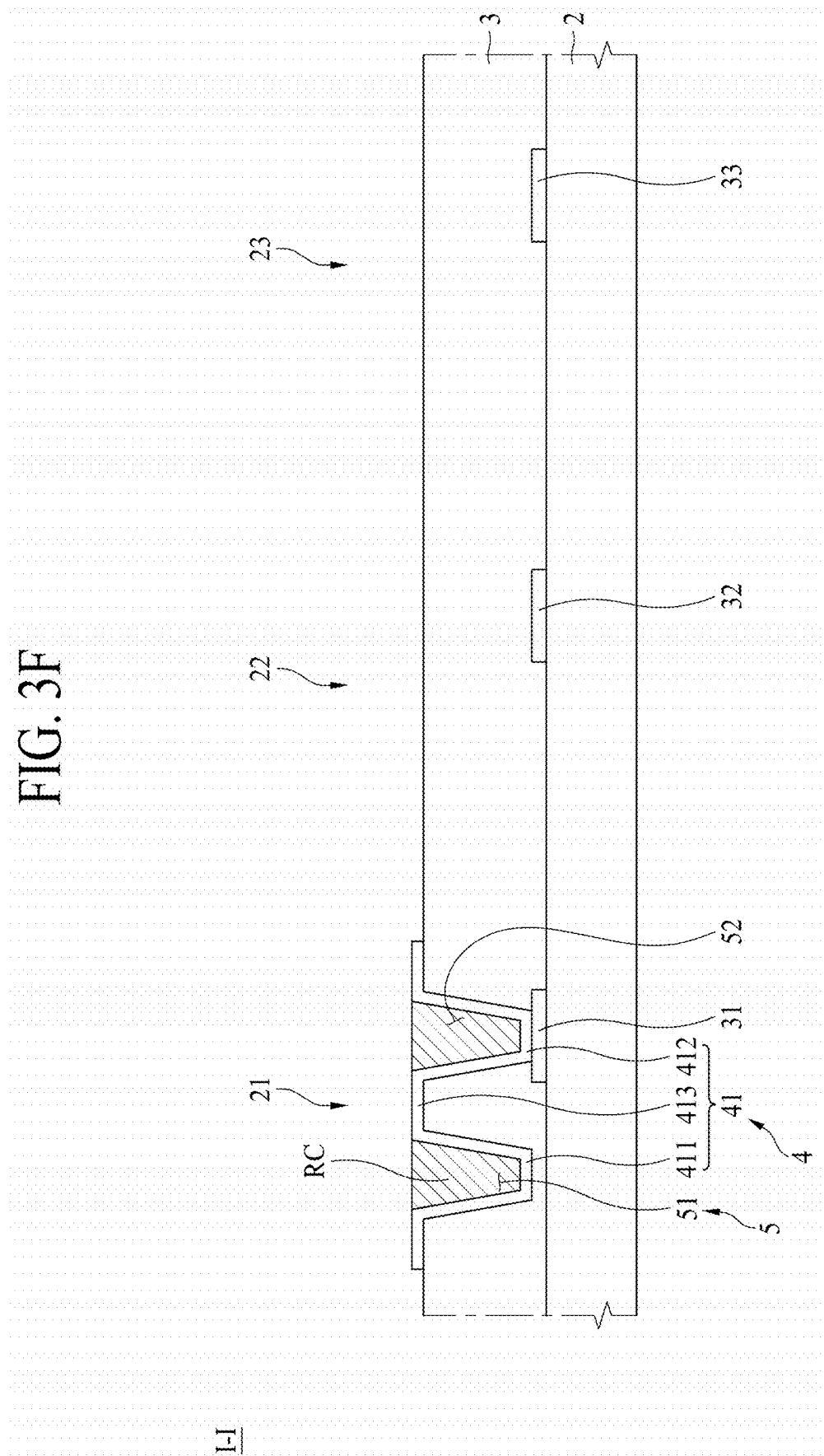

Next, with reference to FIGS. 3D to 3F, after the color member having the same color as that of the first color filter 131, for example, the red color member RC is coated on the entire surface of the first to third subpixels 21, 22 and 23 and baked, the red color member RC is patterned through an etching method such as dry etching such that the red color member RC is arranged on only the first subpixel 21. At this time, the red color member RC may be patterned almost without a step difference from the top surface of the planarization electrode 413.

Figure 3G:
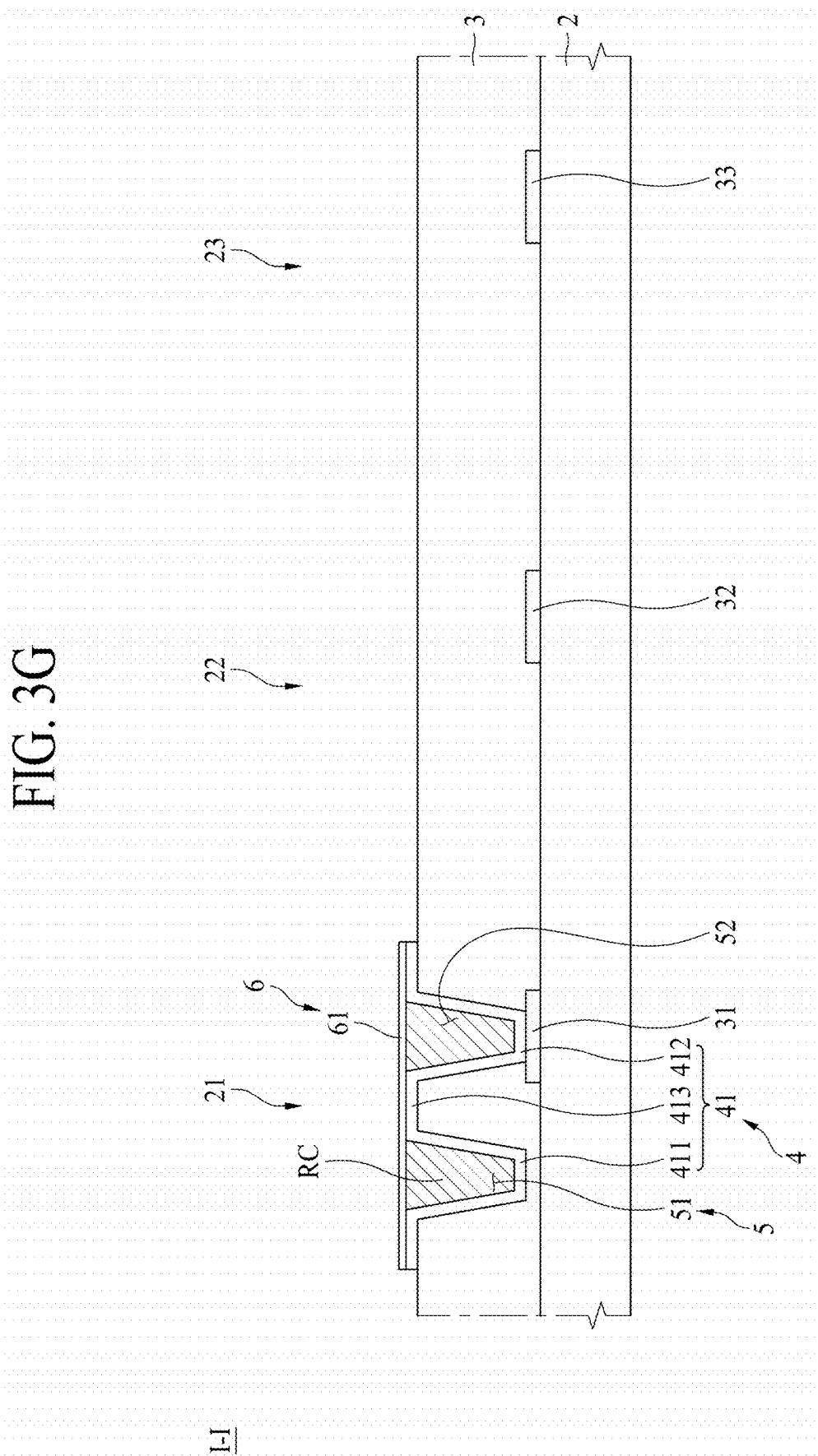

Next, with reference to FIG. 3G, the first transparent electrode 61 is deposited to cover the first sub electrode 41 and then patterned. In more detail, the first transparent electrode 61 may be deposited to cover the first pattern electrode 411, the second pattern electrode 412, the planarization electrode 413, the top surface of the red color member RC filled in the first filling groove 51, and the top surface of the red color member RC filled in the second filling groove 52. Next, the first transparent electrode 61 is patterned such that both ends of the first sub electrode 41 are matched with both ends of the first transparent electrode 61.

In this case, the first transparent electrode 61 is in contact with the first sub electrode 41, whereby the voltage supplied by the first thin film transistor 31 may be applied to the first transparent electrode 61.

Also, as the first transparent electrode 61 may be arranged in almost parallel with the top surface of the substrate 2, the first transparent electrode 61 may be spaced apart from the second electrode 10 formed during a later process at almost same intervals. Therefore, since an electric field may be formed uniformly between the first transparent electrode 61 and the second electrode 10, luminance of the first subpixel 21 may be maintained uniformly as compared with the case that the first transparent electrode 61 is spaced apart from the second electrode at different intervals.

Figure 3H:
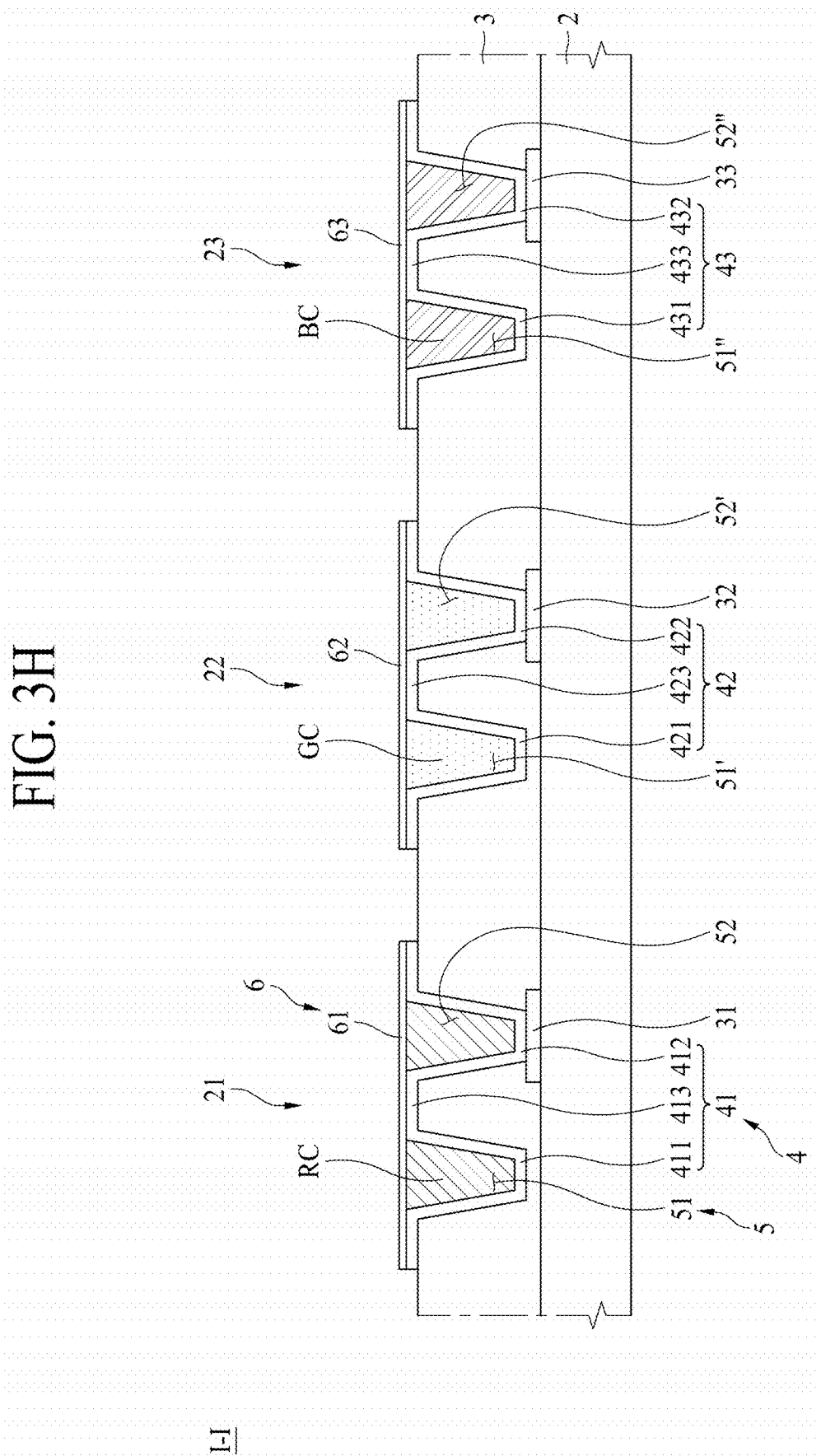

Next, with reference to FIG. 3H, as the process of FIGS. 3A to 3G may be performed repeatedly, after the color member having the same color as that of the second color filter 132, for example, the green color member GC is filled in the first filling groove 51' and the second filling groove 52', the second transparent electrode 62 may be formed on the first pattern electrode 421, the second pattern electrode 422 and the planarization electrode 423 of the second subpixel 22.

Likewise, as the process of FIGS. 3A to 3G may be performed repeatedly, after the color member having the same color as that of the third color filter 133, for example, the blue color member BC is filled in the first filling groove 51" and the second filling groove 52", the third transparent electrode 63 may be formed on the first pattern electrode 431, the second pattern electrode 432 and the planarization electrode 433 of the third subpixel 23. In this way, after the transparent electrode 6 is formed for each of the subpixels 21, 22 and 23, the following process may be performed.

Figure 3I:
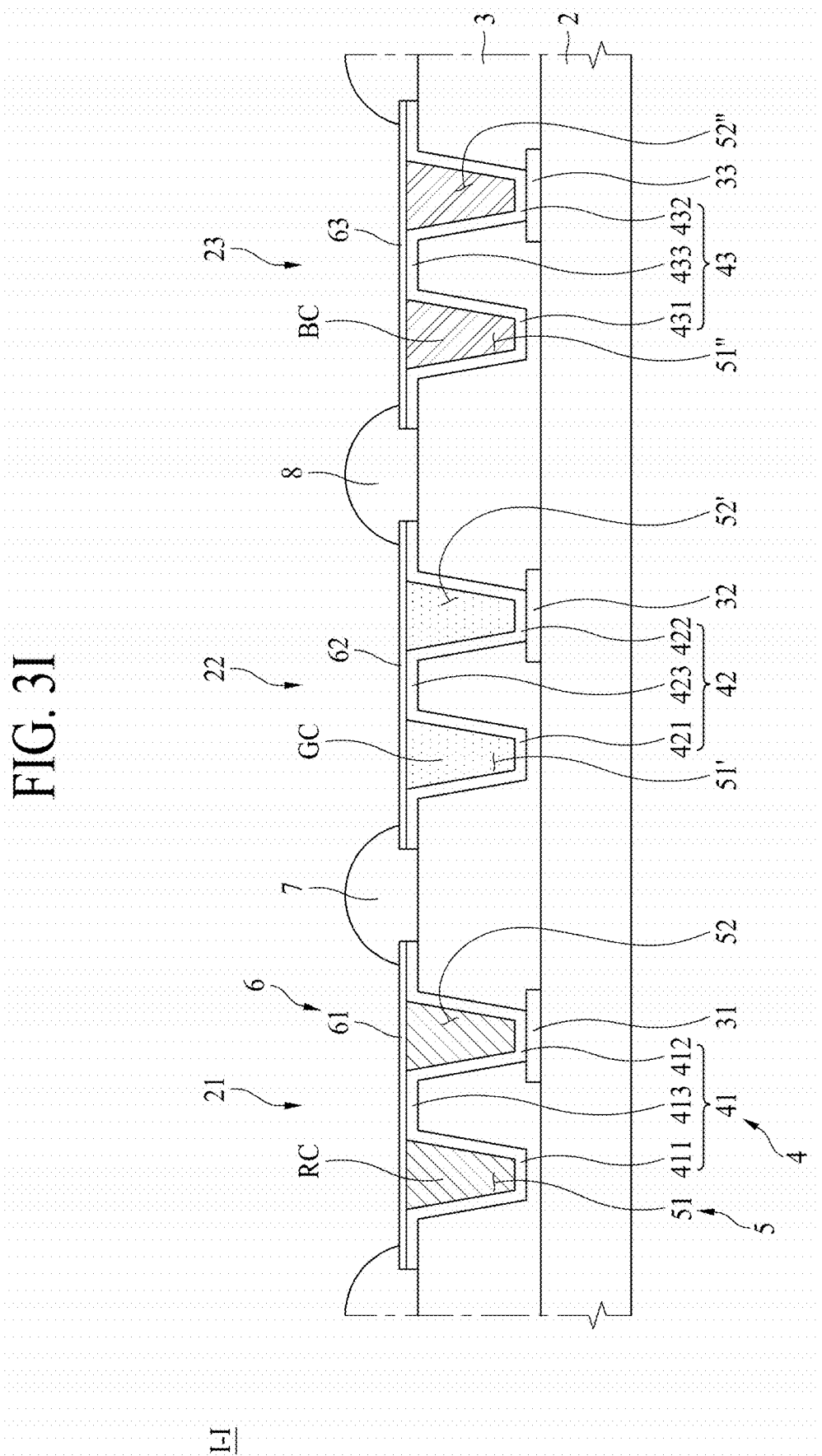

Next, with reference to FIG. 3I, a plurality of banks are formed to cover edges of each of the first electrode 4 and the transparent electrode 6. The plurality of banks may include the first bank 7 and the second bank 8, and these banks may be formed to be simultaneously patterned. The first bank 7 may cover edges of the first sub electrode 41 and the first transparent electrode 61 and edges of the second sub electrode 42 and the second transparent electrode 62. The second bank 8 may cover edges of the second sub electrode 42 and the second transparent electrode 62 and edges of the third sub electrode 43 and the third transparent electrode 63.

Figure 3J:
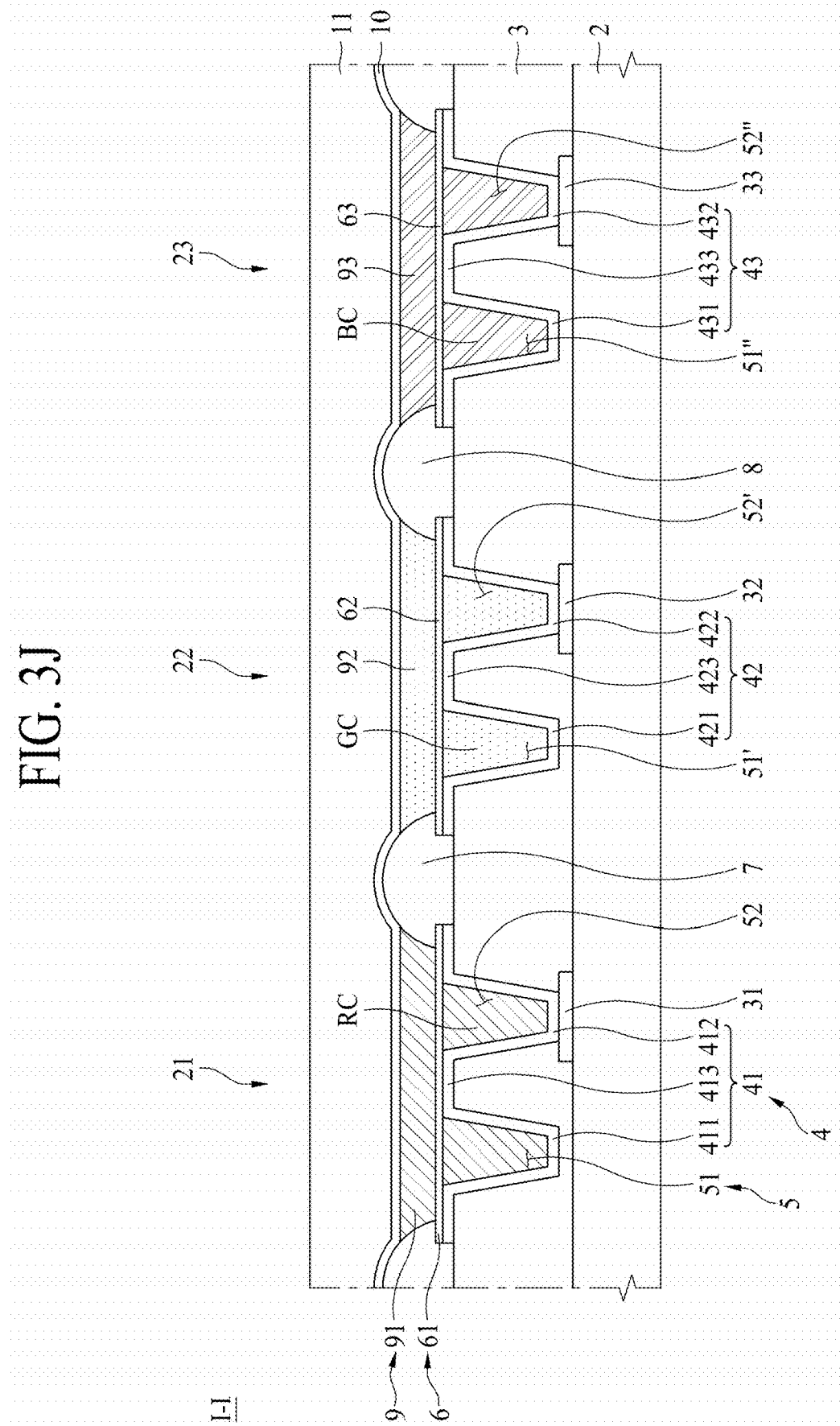

Next, with reference to FIG. 3J, the first to third organic light emitting layers 91, 92 and 93 are respectively deposited on the first to third subpixels 21, 22 and 23. At this time, each of the first to third organic light emitting layers 91, 92 and 93 may be deposited using a fine metal mask (FMM). Then, the second electrode 10 is fully deposited to cover the first to third organic light emitting layers 91, 92 and 93 and the plurality of banks, and the encapsulation layer 11 is formed to cover the second electrode 10. Therefore, the second electrode 10 and the encapsulation layer 11 may be arranged commonly over the first to third subpixels 21, 22 and 23.

Figure 3K:
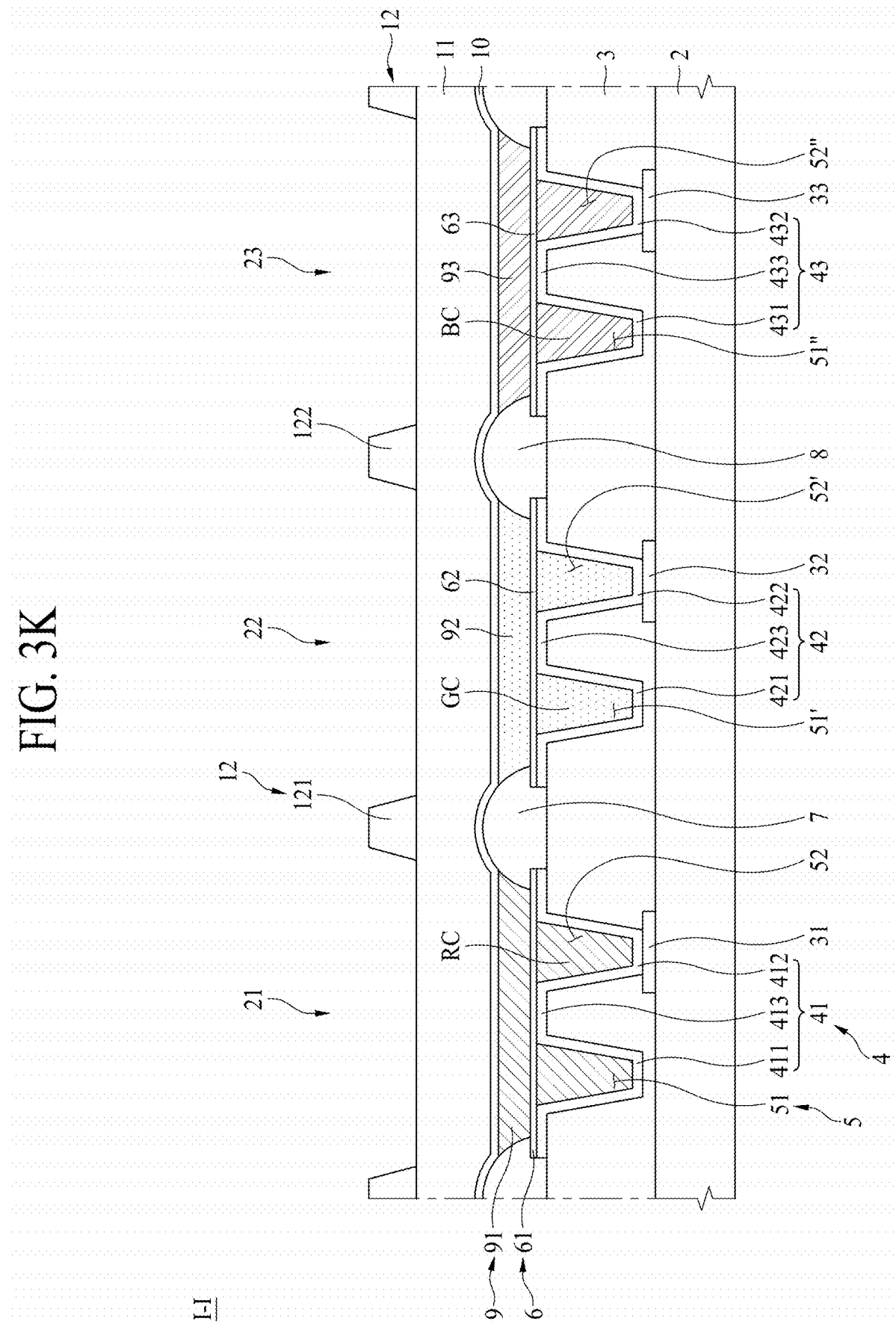

Next, with reference to FIG. 3K, the plurality of matrixes 12 are formed on the encapsulation layer 11. The plurality of black matrixes may include the first black matrix 121 and the second black matrix 122. Each of the plurality of black matrixes 121 and 122 may be patterned to respectively correspond to the plurality of banks 7 and 8. In this case, as shown in FIG. 2, a width BMW1 of the first black matrix 121 may be provided to be smaller than or equal to a width BW1 of the first bank 7. If the width of the first black matrix is greater than the width of the first bank, light emitted from the first organic light emitting layer 91 to the outside is shielded by the first black matrix, whereby luminance is deteriorated. Therefore, as the width BMW1 of the first black matrix 121 may be provided to be smaller than or equal to the width BW1 of the first bank 7, it is possible to prevent light leakage or color mixture from occurring between the first and second subpixels 21 and 22 adjacent to each other without deteriorating luminance. For the same reason, a width BMW2 of the second black matrix 122 may be provided to be smaller than or equal to a width BW2 of the second bank 8.

Next, with reference to FIG. 3L, the first color filter 131 may be deposited to cover the black matrixes provided at both sides of the first subpixel 21 and the encapsulation layer 11 arranged on the first subpixel 21. At this time, as shown in FIG. 2, a thickness T1 of the first color filter 131 may be thicker than a thickness T2 of the first black matrix 121. In this case, since a length of light emitted from the first organic light emitting layer 91, passing through the inside of the first color filter 131 is longer than the case that the thickness of the first color filter is equal to the thickness of the first black matrix, a color reproduction rate may be more improved.

With reference to FIG. 3L again, the first transmissive hole 131a is formed to correspond to the first pattern electrode 411, and the second transmissive hole 131b is formed to correspond to the second pattern electrode 412. The first transmissive hole 131a and the second transmissive hole 131b may be formed respectively by removing the first color filter 131 of the portion corresponding to the first pattern electrode 411 and the first color filter 131 of the portion corresponding to the second pattern electrode 412. Therefore, as shown in FIG. 2, a width W1 of the first filling groove 51 adjacent to the first transparent electrode 61 may be provided to be equal to a width CW1 of the first transmissive hole 131a, and a width W2 of the second filling groove 52 adjacent to the first transparent electrode 61 may be provided to be equal to a width CW2 of the second transmissive hole 131b.

Meanwhile, the planarization electrode 413 arranged between the first pattern electrode 411 and the second pattern electrode 412 may be overlapped with the first color filter 131 arranged between the first transmissive hole 131a and the second transmissive hole 131b. At this time, a width W3 of the planarization electrode 413 may be provided to be equal to a width CW3 of the first color filter 131 arranged between the first transmissive hole 131a and the second transmissive hole 131b. Therefore, on the plane as shown in FIG. 1, a user may view the color member filled in the first filling groove 51 through the first transmissive hole 131a and the color member filled in the second filling groove 52 through the second transmissive hole 131b but cannot view the planarization electrode 413 covered by the first color filter 131. As a result, in the display device 1 according to one embodiment of the present disclosure, when viewed on the plane, the planarization electrode 413 having a color different from that of the color filter may be prevented from being seen to allow the user not to feel any unfamiliarity.

Figure 3M:
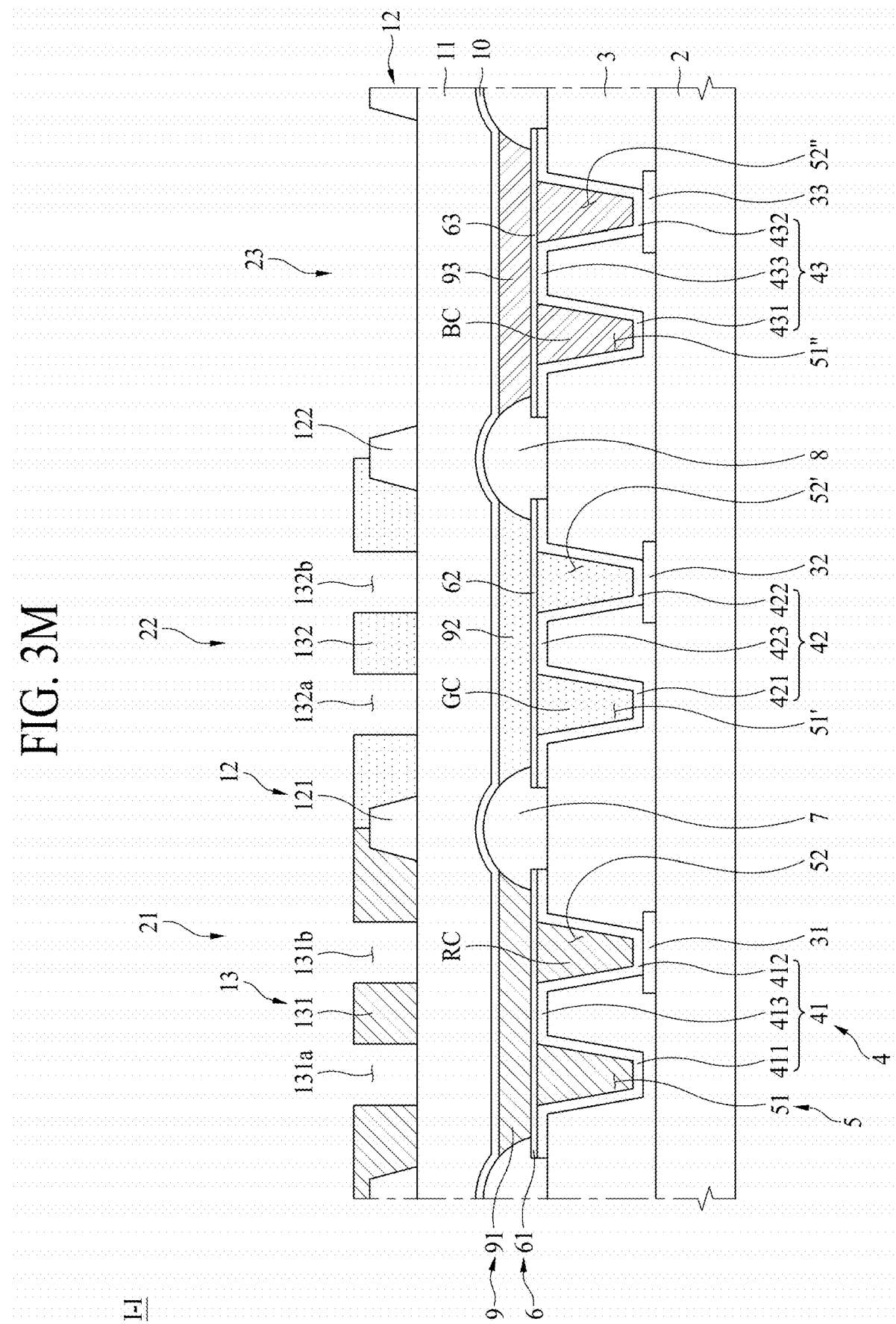

Next, with reference to FIG. 3M and FIG. 3N, as the process of FIG. 3L may be performed repeatedly, the second color filter 132 provided with the first transmissive hole 132a and the second transmissive hole 132b may be formed on the encapsulation layer 11 of the second subpixel 22, and the third color filter 133 provided with the first transmissive hole 133a and the second transmissive hole 133b may be formed on the encapsulation layer 11 of the third subpixel 23. Therefore, as shown in FIG. 3N, the process of the display device 1 according to one embodiment of the present disclosure may partially be completed.

With reference to FIG. 2 again, the width W1 of the first filling groove 51 adjacent to the first transparent electrode 61, the width W2 of the second filling groove 52 adjacent to the first transparent electrode 61, and the width W3 of the planarization electrode 413 may be provided to be equal to one another. In this case, the manufacturing process of the display device 1 of the present disclosure may be more simplified than the case that the width W1 of the first filling groove 51 adjacent to the first transparent electrode 61, the width W2 of the second filling groove 52 adjacent to the first transparent electrode 61, and the width W3 of the planarization electrode 413 are provided to be different from one another, whereby a tact time required to manufacture the complete display device may be reduced.

Meanwhile, in the display device 1 according to one embodiment of the present disclosure, as the color member filled in each of the first and second filling grooves 51 and 52 formed in the first sub electrode 41 of the first subpixel 21, the first color filter 131 arranged on the encapsulation layer 11, and the first organic light emitting layer 91 are all provided with the same color, when viewed on the plane, it may prevent the user from feeling any unfamiliarity. This structure may equally be applied to the second subpixel 22 and the third subpixel 23.

In the display device 1 according to one embodiment of the present disclosure, as shown in FIG. 3N, light emitted from the first organic light emitting layer 91 may have three types of light paths based on the first subpixel 21. The first light path L1 is a path through which light emitted from the first organic light emitting layer 91 is partially emitted through the first transmissive hole 131a or the second transmissive hole 131b. Since the light emitted from the first organic light emitting layer 91 does not pass through the first color filter 131 in the first light path L1, among the first light path L1, the second light path L2 and the third light path L3, the first light path L1 may have the highest light transmittance.

On the other hand, since the light emitted from the first organic light emitting layer 91 partially passes through the first color filter 131 in the second light path L2, the second light path L2 may have light transmittance lower than that of the first light path L1. However, the second light path L2 may be a path for embodying a color close to a red color as red light emitted from the first organic light emitting layer 91 passes through the first color filter 131 which is a red color filter. That is, the second light path L2 is a path that can enhance a color reproduction rate.

Next, the third light path L3 is a path through which light emitted from the first organic light emitting layer 91 is partially emitted to a lower side and reflected by the second pattern electrode 412 and then emitted to the outside after its path is changed to an upper side. Therefore, the third light path L3 is a path through which light is emitted to the outside through the second transmissive hole 131b by passing through the inside of the red color member RC filled in the second filling groove 52. Since the light is emitted through the red color member RC formed of the same material as that of the first color filter 131 in the third light path L3, the third light path L3 may have the same light transmittance as that of the light emitted through the second light path L2. Since the red light of the first organic light emitting layer 91 is also emitted by passing through the inside of the red color member RC in the third light path L3, the third light path L3 is a path that can enhance a color reproduction rate like the second light path L2.

As a result, in the display device 1 according to one embodiment of the present disclosure, as the first color filter 131 is provided with a plurality of transmissive holes 131a and 131b, light transmittance may be improved to enhance luminance. Also, as the first color filter 131 having the same color as that of the light emitted from the first organic light emitting layer 91 is provided, a color reproduction rate may be enhanced, and when viewed on the plane, the filling grooves 51 and 52 are arranged in the position corresponding to the transmissive holes 131a and 131b and the color member having of the same color as that of the first color filter 131 is filled therein, whereby it is possible to prevent the user from feeling unfamiliarity.

Meanwhile, in the display device 1 according to one embodiment of the present disclosure, a rate of the plurality of transmissive holes occupied in the entire light emitting area may be 50% or more and 80% or less. In this case, the entire light emitting area may mean the entire area of light emitted from the organic light emitting layer 9 as an electric field is formed between the first electrode 4 and the second electrode 10, and may be at least an entire area where the transparent electrode 6 and the organic light emitting layer 9 are in contact with each other. If the rate of the plurality of transmissive holes occupied in the entire light emitting area is less than 50%, the amount of light emitted from the organic light emitting layer 9 and output through only the transmissive hole without passing through the color filter is reduced, that is, light transmittance is lowered, whereby a problem occurs in that light efficiency is reduced as compared with the case that the rate of the plurality of transmissive holes occupied in the entire light emitting area is 50% or more. On the other hand, if the rate of the plurality of transmissive holes occupied in the entire light emitting area exceeds 80%, the number of transmissive holes to be formed in the color filter is too increased, whereby a problem occurs in that it is difficult to perform the manufacturing process of the display device. Therefore, in the display device 1 according to one embodiment of the present disclosure, the rate of the plurality of transmissive holes occupied in the entire light emitting area is provided to be 50% or more and 80% or less, light transmittance may be improved and a color reproduction rate may be enhanced.

Figure 4:
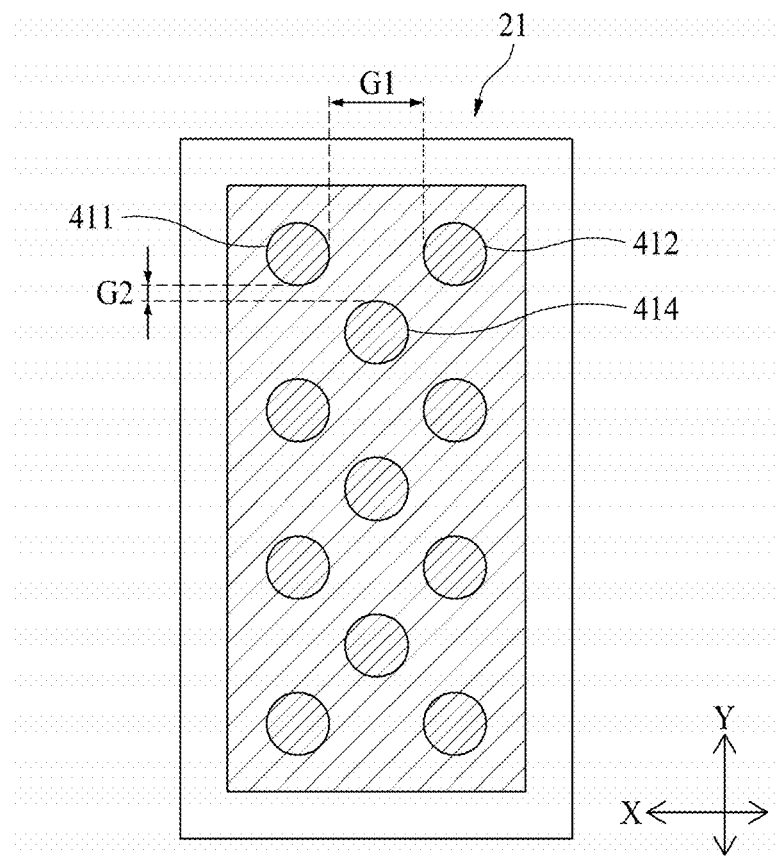
FIG. 4 illustrates a first subpixel shown in FIG. 1.

FIG. 4 illustrates a first subpixel shown in FIG. 1.

With reference to FIG. 4, the first sub electrode 41 may further include a third pattern electrode 414. The third pattern electrode 414 may be spaced apart from each of the first pattern electrode 411 and the second pattern electrode 412. In more detail, the first pattern electrode 411 and the second pattern electrode 412 may be arranged in a line in a first axis direction, and the third pattern electrode 414 may be arranged in a second axis direction (Y-axis direction) vertical to the first axis direction.

In this case, the third pattern electrode 414 may be arranged between the first pattern electrode 411 and the second pattern electrode 412. That is, as shown in FIG. 4, the third pattern electrode 414 may be arranged within a first spaced interval G1 between the first pattern electrode 411 and the second pattern electrode 412. For example, the third pattern electrode 414 may be arranged in the position corresponding to the planarization electrode 413 arranged between the first pattern electrode 411 and the second pattern electrode 412 in a second axis direction (Y-axis direction). As the third pattern electrode 414 is arranged within the first spaced interval G1, a second spaced interval G2 between the first pattern electrode 411 and the third pattern electrode 414 may be reduced in the display device 1 according to one embodiment of the present disclosure.

As a result, in the display device 1 according to one embodiment of the present disclosure, as the third pattern electrode 414 is arranged within the first spaced interval G1, the second spaced interval G2 may be reduced to reduce a width of the second axis direction (Y-axis direction), whereby a display device of high resolution, which has a vertical length reduced based on FIG. 4, may be embodied. Based on this arrangement structure, the width of the first axis direction (X-axis direction) may be reduced, whereby the display device of high resolution, which has a horizontal length reduced based on FIG. 4, may be embodied.

Although the display device 1 according to one embodiment of the present disclosure has been described based on that the transmissive holes are formed in a circular shape when viewed on the plane as shown in FIG. 1, the transmissive holes may be formed in another shape such as a rectangular shape or a combined shape of a circular shape and a rectangular shape.

Figure 5A:
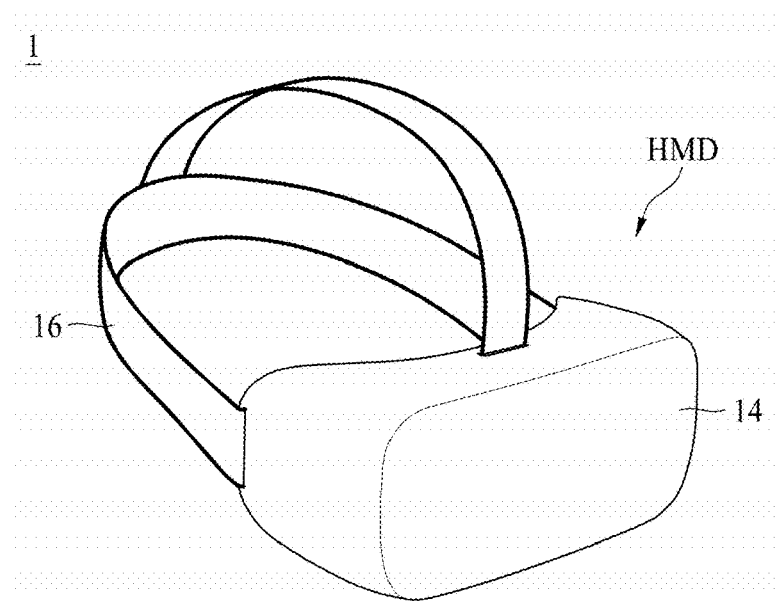
FIGS. 5A to 5C are views illustrating a display device according to another embodiment of the present disclosure, and relate to a head-mounted display (HMD) device.
Figure 5B:
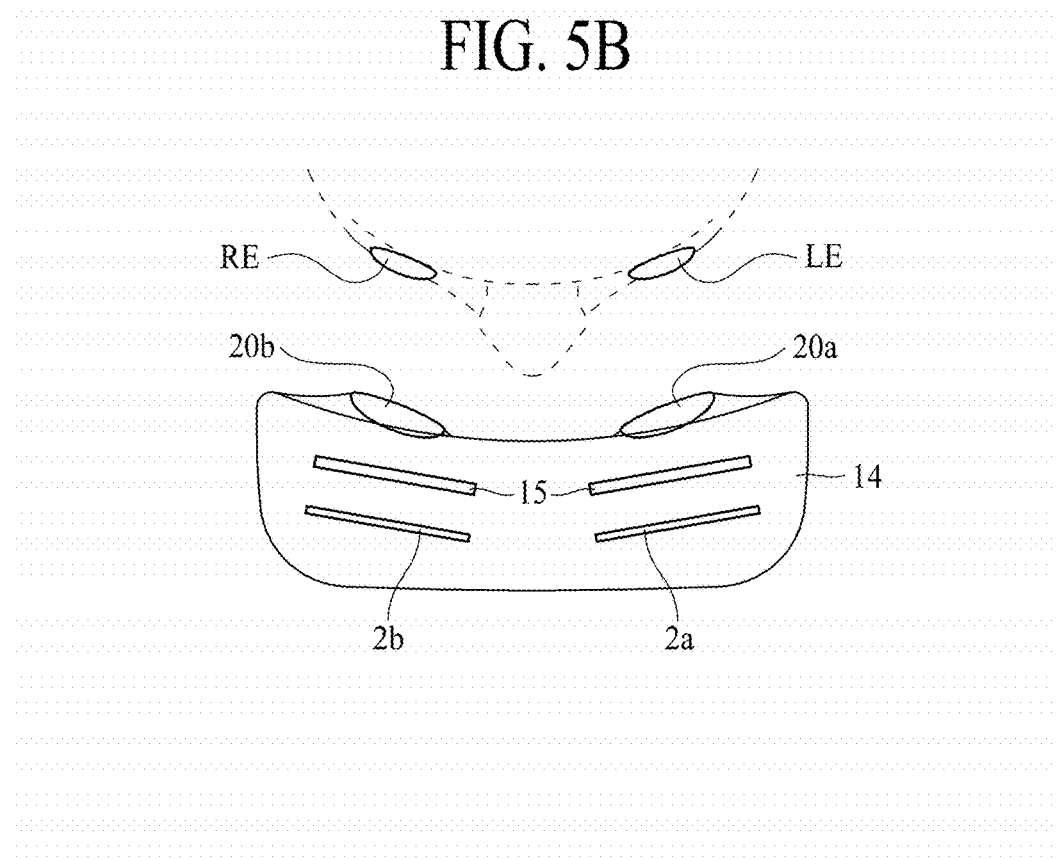
Figure 5C:
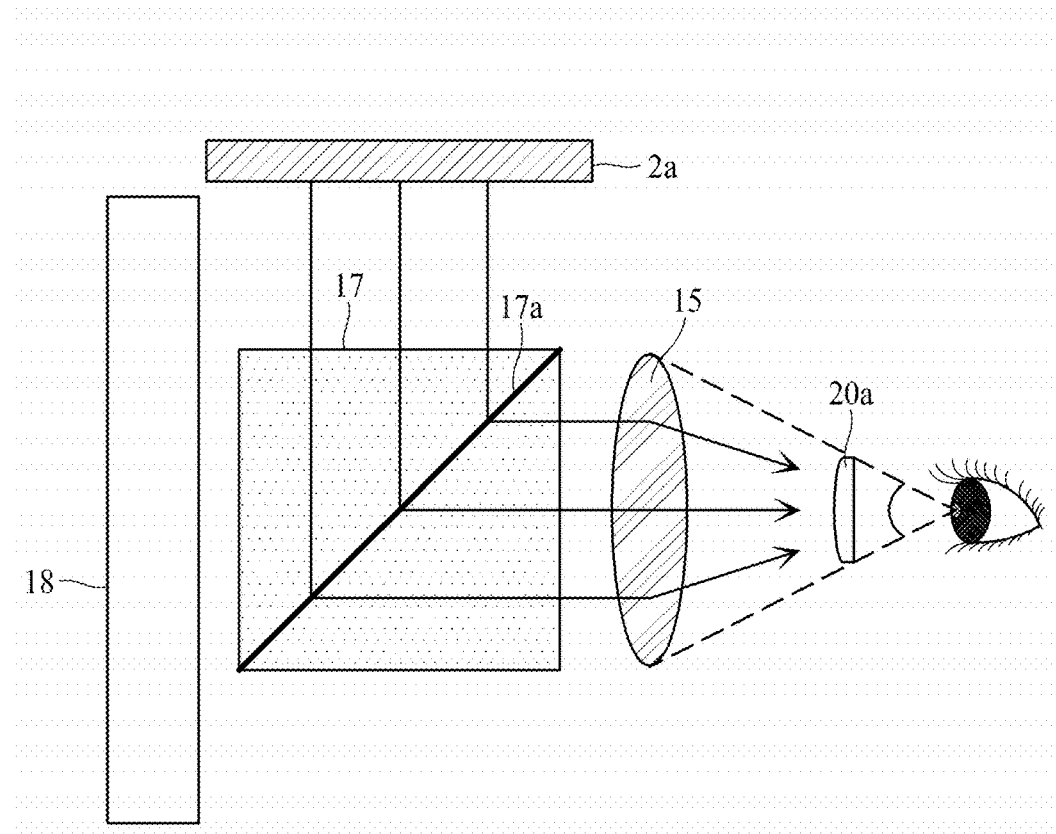

FIGS. 5A to 5C are views illustrating a display device according to another embodiment of the present disclosure, and relate to a head-mounted display (HMD) device. FIG. 5A is brief perspective view, FIG. 5B is a brief plane view of a virtual reality (VR) structure, and FIG. 5C is a brief cross-sectional view of an augmented reality (AR) structure.

As will be aware of it from FIG. 5A, a head mounted display device according to present disclosure comprises a storage case 14 and a head mounted band 16.

The storage case 14 stores elements such as a display device, a lens array, and an ocular lens therein.

The head mounted band 16 is fixed to the storage case 14. The head mounted band 16 is formed to surround a top surface and both sides of a user's head, but is not limited to this example. The head mounted band 16 is to fix a head mounted display to a user's head, and may be replaced with a structure of a shape of a glasses frame or a helmet shape.

As will be aware of it from FIG. 5B, the head mounted display device 1 of a virtual reality (VR) structure according to the present disclosure may include a left eye display device 3a, a right eye display device 3b, a lens array 15, a left eye ocular lens 20a, and a right eye ocular lens 20b.

The left eye display device 3a, the right eye display device 3b, the lens array 15, the left eye ocular lens 20a and the right eye ocular lens 20b are stored in the storage case 14 described above.

The left eye display device 3a and the right eye display device 3b may display the same image, and in this case, a user may view 3D image. Alternatively, the left eye display device 3a may display a left eye image and the right eye display device 3b may display a right eye image, and in this case, a user may view a 3D image. Each of the left eye display device 3a and the right eye display device 3b may be comprised of a display device according to FIGS. 1 to 4 described above. For example, each of the left eye display device 3a and the right eye display device 3b may be an organic light emitting display device.

Each of the left eye display device 3a and the right eye display device 3b may include a plurality of subpixels, a circuit element layer 3, a first electrode 4, a filling groove 5, a transparent electrode 6, a first bank 7, a second bank 8, an organic light emitting layer 9, a second electrode 10, an encapsulation layer 11, a black matrix 12, and a color filter 13, and may display various images by combining colors of light emitted from each of the subpixels in various manners.

The lens array 15 may be provided between the left eye ocular lens 20a and the left eye display device 3a by being spaced apart from each of the left eye ocular lens 20a and the left eye display device 3a. That is, the lens array 15 may be arranged in front of the ocular lens 20a and behind the left eye display device 3a. Also, the lens array 15 may be provided between the right eye ocular lens 20b and the right eye display device 3b by being spaced apparat from each of the right eye ocular lens 20b and the right eye display device 3b. That is, the lens array 15 may be arranged in front of the right eye ocular lens 20b and behind the right eye display device 3b.

The lens array 15 may be a micro lens array. The lens array 15 may be replaced with a pin hole array. Due to the lens array 15, images displayed on a left eye display device 3a or a right eye display device 3b may be viewed to be magnified to a user.

A left eye LE of a user may be arranged in the left eye ocular lens 20a, and a right eye RE of a user may be arranged in the right eye ocular lens 20b.

As will be aware of it from FIG. 5C, a head mounted display device of an augmented reality (AR) structure according to the present disclosure includes a left eye display device 3a, a lens array 15, a left eye ocular lens 20a, a transmissive reflection portion 17, and a transmissive window 18. Although only a structure for a left eye is shown in FIG. 5C for convenience, a structure for a right eye is the same as the structure for the left eye.

The left eye display device 3a, the lens array 15, the left eye ocular lens 20a, the transmissive reflection portion 17, and the transmissive window 18 are stored in the aforementioned storage case 14.

The left eye display device 3a may be arranged at one side of the transmissive reflection portion 17, for example, at an upper side, without covering the transmissive window 18. Therefore, the left eye display device 3a may provide the transmissive reflection portion 17 with an image without covering an outer background viewed through the transmissive window 18.

The left eye display device 3a may be comprised of an electroluminescence display device according to FIGS. 1 to 4 described above. In this case, the top portion corresponding to the surface where images are displayed in FIGS. 1 to 4, for example, the color filter 13 faces the transmissive reflection portion 17.

The lens array 15 may be provided between the left eye ocular lens 20a and the transmissive reflection portion 17.

A left eye of a user is arranged in the left eye ocular lens 20a.

The transmissive reflection portion 17 is arranged between the lens array 15 and the transmissive window 18. The transmissive reflection portion 17 may include a reflective surface 17a which transmits a portion of light and reflects another portion of light. The reflective surface 17a is formed to allow an image displayed on the left eye display device 3a to proceed to the lens array 15. Therefore, a user may view all of images displayed on the left eye display device 3a and an outer background through the transmissive window 18. That is, since the user may view one image by overlapping background in reality with virtual images, augmented reality (AR) may be embodied.

The transmissive window 18 is arranged in front of the transmissive reflection portion 17.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate provided with a first subpixel and a second subpixel;
   a first electrode provided on the substrate, including a first sub electrode provided on the first subpixel and a second sub electrode provided on the second subpixel;
   a transparent electrode including a first transparent electrode provided to cover the first sub electrode and a second transparent electrode provided to cover the second sub electrode;
   an organic light emitting layer including a first organic light emitting layer arranged on the first transparent electrode and a second organic light emitting layer arranged on the second transparent electrode;
   a second electrode arranged on the organic light emitting layer;
   a first bank provided between the first transparent electrode and the second transparent electrode to partition the first subpixel and the second subpixel from each other; and
   a first color filter arranged to correspond to the first subpixel,
   wherein the first sub electrode includes a first pattern electrode formed on the substrate and a second pattern electrode spaced apart from the first pattern electrode,
   the first color filter includes a first transmissive hole arranged to correspond to the first pattern electrode and a second transmissive hole arranged to correspond to the second pattern electrode, and
   each of a first filling groove formed between the first pattern electrode and the first transparent electrode to correspond to the first transmissive hole and a second filling groove formed between the second pattern electrode and the first transparent electrode to correspond to the second transmissive hole is filled with a color member having the same color as that of the first color filter.

2. The display device of claim 1, wherein the first filling groove adjacent to the first transparent electrode has a width equal to that of the first transmissive hole.

3. The display device of claim 1, further comprising a circuit element layer provided on the substrate, including a first thin film transistor provided on the first subpixel and a second thin film transistor provided on the second subpixel,
   wherein the first pattern electrode and the second pattern electrode are formed inside the circuit element layer, and
   at least one of the first pattern electrode and the second pattern electrode is in contact with the first thin film transistor.

4. The display device of claim 3, wherein the first sub electrode includes a planarization electrode arranged between the first pattern electrode and the second pattern electrode, and the planarization electrode is arranged on a top surface of the circuit element layer.

5. The display device of claim 4, wherein the planarization electrode is overlapped with the first color filter arranged between the first transmissive hole and the second transmissive hole.

6. The display device of claim 4, wherein the first pattern electrode, the second pattern electrode, and the planarization electrode are connected with one another.

7. The display device of claim 4, wherein the planarization electrode has a width equal to that of the first filling groove adjacent to the first transparent electrode.

8. The display device of claim 1, wherein the first filling groove and the second filling groove have the same shape as each other.

9. The display device of claim 8, wherein the first filling groove is formed in a rectangular or trapezoidal shape.

10. The display device of claim 1, wherein the first sub electrode includes a third pattern electrode spaced apart from each of the first pattern electrode and the second pattern electrode, the first pattern electrode and the second pattern electrode are arranged in a line in a first axis direction, and the third pattern electrode is arranged in a second axis direction vertical to the first axis direction and arranged between the first pattern electrode and the second pattern electrode.

11. The display device of claim 1, further comprising:
an encapsulation layer arranged on the second electrode; and
a first black matrix arranged on the encapsulation layer, wherein the first black matrix is arranged to correspond to the first bank.

12. The display device of claim 11, wherein the first black matrix has a width smaller than or equal to that of the first bank.

13. The display device of claim 11, wherein the first color filter is provided to cover the first black matrix and the encapsulation layer, and has a thickness thicker than that of the first black matrix.

14. The display device of claim 1, wherein the substrate includes a third subpixel adjacent to one side of the second subpixel,
the circuit element layer is provided on the substrate and includes a third thin film transistor provided on the third subpixel,
the first electrode includes a third sub electrode provided on the substrate and provided on the third subpixel,
the transparent electrode includes a third transparent electrode provided to cover the third sub electrode,
the organic light emitting layer includes a third organic light emitting layer arranged on the third transparent electrode, and
the first organic light emitting layer, the second organic light emitting layer and the third organic light emitting layer respectively emit red light, green light and blue light.

15. The display device of claim 14, further comprising:
a second bank provided between the second transparent electrode and the third transparent electrode to partition the second subpixel and the third subpixel from each other;
an encapsulation layer arranged on the second bank and the second electrode; and
a second black matrix arranged on the encapsulation layer to correspond to the second bank,
wherein the second black matrix has a width smaller than or equal to that of the second bank.

16. The display device of claim 1, wherein light emitted from the first organic light emitting layer, the first color filter and the color member are all provided with the same color.

17. The display device of claim 1, further comprising a lens array spaced apart from the substrate, and a storage case storing the substrate and the lens array.

* * * * *